US011870459B2

(12) United States Patent
Solomon et al.

(10) Patent No.: US 11,870,459 B2
(45) Date of Patent: Jan. 9, 2024

(54) UNIVERSAL GUESSING RANDOM ADDITIVE NOISE DECODING (GRAND) DECODER

(71) Applicants: Massachusetts Institute of Technology, Cambridge, MA (US); Trustees of Boston University, Boston, MA (US); National University of Ireland, Maynooth, Maynooth (IE)

(72) Inventors: Amit Solomon, Cambridge, MA (US); Muriel Medard, Belmont, MA (US); Kenneth R. Duffy, Dublin (IE); Rabia Tugce Yazicigil Kirby, Cambridge, MA (US); Vaibhav Bansal, Boston, MA (US); Wei An, Newton, MA (US)

(73) Assignees: Massachusetts Institute of Technology, Cambridge, MA (US); National University of Ireland Maynooth, Maynooth (IE); Trustees of Boston University, Boston, MA (US)

( * ) Notice: Subject to any disclaimer, the term of this patent is extended or adjusted under 35 U.S.C. 154(b) by 334 days.

(21) Appl. No.: 17/225,818

(22) Filed: Apr. 8, 2021

(65) Prior Publication Data

US 2021/0384918 A1 Dec. 9, 2021

Related U.S. Application Data

(60) Provisional application No. 63/036,237, filed on Jun. 8, 2020.

(51) Int. Cl.
| H03M 13/11 | (2006.01) |
| H03M 13/00 | (2006.01) |
| H03M 13/27 | (2006.01) |

(52) U.S. Cl.
CPC .... H03M 13/1105 (2013.01); H03M 13/1148 (2013.01); H03M 13/2778 (2013.01); H03M 13/6575 (2013.01)

(58) Field of Classification Search
CPC ......... H03M 13/1105; H03M 13/1148; H03M 13/2778; H03M 13/6575; H03M 13/27; H03M 13/3746; H03M 13/451
(Continued)

(56) References Cited

U.S. PATENT DOCUMENTS 6,038,676 A * 3/2000 Yanes ................... G06F 11/076
714/1
6,138,264 A 10/2000 Nava et al.
(Continued)

FOREIGN PATENT DOCUMENTS

EP 1819058 8/2007
WO WO 2021/115670 A1 6/2021

OTHER PUBLICATIONS

International Search Report and Written Opinion dated Jun. 30, 2021 for International Application No. PCT/US21/26412; 8 Pages.
(Continued)

*Primary Examiner* — Albert Decady
*Assistant Examiner* — Enam Ahmed
(74) *Attorney, Agent, or Firm* — Daly, Crowley, Mofford & Durkee, LLP

(57) ABSTRACT

Described is a decoder suitable for use with any communication or storage system. The described decoder has a modular decoder hardware architecture capable of implementing a noise guessing process and due to its dependency only on noise, the decoder design is independent of any
(Continued)

encoder, thus making it a universal decoder. Hence, the decoder architecture described herein is agnostic to any coding scheme.

14 Claims, 22 Drawing Sheets

(58) Field of Classification Search
USPC .......................................................... 714/1
See application file for complete search history.

(56) References Cited

U.S. PATENT DOCUMENTS

| | | | |
|---|---|---|---|
| 6,511,280 | B1 | 1/2003 | Sammartino et al. |
| 6,625,226 | B1 | 9/2003 | Gersho et al. |
| 7,209,867 | B2 | 4/2007 | Vigoda et al. |
| 7,734,596 | B2* | 6/2010 | Vivian ................. G06F 11/2097 707/636 |
| 7,860,687 | B2 | 12/2010 | Vigoda et al. |
| 8,335,484 | B1 | 2/2012 | Arad et al. |
| 8,479,085 | B2 | 7/2013 | Jo et al. |
| 8,851,382 | B2 | 10/2014 | Powers et al. |
| 8,898,504 | B2* | 11/2014 | Baumgartner ............. H04L 1/22 714/1 |
| 9,246,156 | B2 | 1/2016 | Kwag et al. |
| 9,432,059 | B1 | 8/2016 | Sakamoto |
| 9,769,003 | B2 | 9/2017 | Bogdan |
| 9,998,148 | B2 | 6/2018 | Lin et al. |
| 10,311,243 | B2 | 6/2019 | Calmon et al. |
| 10,491,432 | B1 | 11/2019 | Medra et al. |
| 10,608,672 | B2 | 3/2020 | Medard et al. |
| 10,608,673 | B2 | 3/2020 | Medard et al. |
| 10,944,610 | B2 | 3/2021 | Medard et al. |
| 11,095,314 | B2 | 8/2021 | Medard et al. |
| 11,431,368 | B2 | 8/2022 | Medard et al. |
| 11,451,247 | B2 | 9/2022 | Medard et al. |
| 11,652,498 | B2 | 5/2023 | Duffy |
| 11,720,441 | B2* | 8/2023 | Lee ...................... G06F 11/1048 714/1 |
| 2002/0046382 | A1 | 4/2002 | Yang |
| 2002/0052718 | A1* | 5/2002 | Little .................. G06F 11/2257 714/1 |
| 2002/0161560 | A1 | 10/2002 | Abe et al. |
| 2004/0148560 | A1* | 7/2004 | Hocevar ............. H03M 13/118 714/801 |
| 2004/0264555 | A1 | 12/2004 | Hegde et al. |
| 2006/0070256 | A1 | 4/2006 | Weissman et al. |
| 2006/0070257 | A1 | 4/2006 | Weissman et al. |
| 2006/0123277 | A1 | 6/2006 | Hocevar |
| 2007/0011568 | A1 | 1/2007 | Hocevar |
| 2007/0041458 | A1 | 2/2007 | Hocevar et al. |
| 2007/0086539 | A1 | 4/2007 | Hocevar |
| 2008/0075206 | A1 | 3/2008 | Ordentlich et al. |
| 2009/0249159 | A1 | 10/2009 | Lee et al. |
| 2010/0074319 | A1 | 3/2010 | Tseng et al. |
| 2010/0135375 | A1* | 6/2010 | Lee ...................... H04L 1/0005 375/231 |
| 2010/0223534 | A1 | 9/2010 | Earnshaw et al. |
| 2011/0072330 | A1 | 3/2011 | Kolze |
| 2014/0146969 | A1 | 5/2014 | Sadot et al. |
| 2015/0236726 | A1 | 8/2015 | Sankaranarayanan et al. |
| 2016/0269160 | A1 | 9/2016 | Noh et al. |
| 2016/0329978 | A1 | 11/2016 | Zukunft et al. |
| 2017/0134193 | A1 | 5/2017 | Sugihara |
| 2017/0373910 | A1 | 12/2017 | Shahmohammadian et al. |
| 2018/0226999 | A1 | 8/2018 | Wang et al. |
| 2018/0254882 | A1 | 9/2018 | Bogdan |
| 2019/0199377 | A1 | 6/2019 | Medard et al. |
| 2019/0199473 | A1 | 6/2019 | Medard et al. |
| 2020/0106506 | A1 | 4/2020 | Bhamidipati et al. |
| 2020/0322703 | A1 | 10/2020 | Bures et al. |
| 2021/0288685 | A1 | 9/2021 | Medard et al. |
| 2021/0376953 | A1* | 12/2021 | Gross .................. H03M 13/451 |
| 2021/0405770 | A1 | 12/2021 | Chauvin et al. |
| 2022/0014214 | A1 | 1/2022 | Medard et al. |
| 2022/0302931 | A1 | 9/2022 | Duffy |
| 2022/0376725 | A1 | 11/2022 | Medard et al. |
| 2022/0393702 | A1 | 12/2022 | Medard et al. |

OTHER PUBLICATIONS

Solomon et al., "Soft Maximum Likelihood Decoding using GRAND", [online] InICC 2020-2020, IEEE International Conference on Communications (ICC); Jan. 9, 2020; 6 Pages.
U.S. Notice of Allowance dated Jun. 17, 2022 for U.S. Appl. No. 17/371,925; 21 Pages.
PCT International Preliminary Report on Patentability dated Dec. 22, 2022 for International Application No. PCT/US2021/026412; 6 Pages.
U.S. Non-Final Office Action dated Oct. 31, 2022 for U.S. Appl. No. 17/814,349; 12 Pages.
Valembois, Antoine et al. "An Improved Method to Compute Lists of Binary Vectors that Optimize a Given Weight Function with Application to Soft-Decision Decoding" IEEE Communications Letters, vol. 5, No. 11; Nov. 2001; 3 Pages.
U.S. Appl. No. 17/636,587, filed Feb. 18, 2022, Duffy.
U.S. Non-Final Office Action dated Aug. 14, 2019 for U.S. Appl. No. 16/026,811; 9 Pages.
Response to Non-Final Office Action dated Aug. 14, 2019 for U.S. Appl. No. 16/026,811, filed Oct. 4, 2019; 5 Pages.
Notice of Allowance dated Dec. 17, 2019 for U.S. Appl. No. 16/026,811; 7 pages.
U.S. Non-Final Office Action dated Oct. 28, 2019 for U.S. Appl. No. 16/026,822; 6 pages.
Response to Non-Final Office Action dated Oct. 28, 2019 for U.S. Appl. No. 16/026,822, filed Nov. 6, 2019; 2 pages.
Notice of Allowance dated Dec. 4, 2019 for U.S. Appl. No. 16/026,822; 5 pages.
U.S. Non-Final Office Action dated Oct. 29, 2020 for U.S. Appl. No. 16/765,083; 12 Pages.
Response to Non-Final Office Action dated Oct. 29, 2020 for U.S. Appl. No. 16/765,083, filed Dec. 1, 2020; 7 Pages.
Notice of Allowance dated Dec. 11, 2020 for U.S. Appl. No. 16/765,083; 13 Pages.
U.S. Non-Final Office Action dated Feb. 4, 2021 for U.S. Appl. No. 16/793,224; 20 Pages.
Response to U.S. Non-Final Office Action dated Feb. 4, 2021 for U.S. Appl. No. 16/793,224; Response filed Mar. 31, 2021; 7 Pages.
Notice of Allowance dated Apr. 12, 2021 for U.S. Appl. No. 16/793,224; 8 Pages.
Preliminary Amendment dated Oct. 20, 2021 for U.S. Appl. No. 17/371,925; 5 Pages.
Communication Pursuant to Rules 161(1) and 162 EPC for European Application No. 18834223.2 dated Jul. 29, 2020; 3 Pages.
Response (with amended claims and descriptions) to Communication Pursuant to Rules 161(1) and 162 EPC for European Application No. 18834223.2 dated Jul. 29, 2020; Response filed on Oct. 23, 2020; 22 Pages.
Communication Under Rule 71(3) EPC Intention to Grant for European Application No. 18834223.2 dated Oct. 15, 2021; 7 Pages.
PCT International Search Report dated Apr. 4, 2019, for Application No. PCT/US2018/066810; 5 Pages.
PCT Written Opinion of the International Searching Authority dated Apr. 4, 2019, for Application No. PCT/US2018/066810; 9 Pages.
International Preliminary Report on Patentability dated Jul. 2, 2020 for International Application No. PCT/US2018/066810; 8 Pages.
International Preliminary Report on Patentability dated Jul. 2, 2020 for International Application No. PCT/US2018/066813; 8 Pages.
International Search Report and Written Opinion for International Patent Application No. PCT/EP2020/079671 dated Jan. 18, 2021; 20 Pages.
PCT International Search Report dated Apr. 4, 2019, for Application No. PCT/US2018/066813; 5 Pages.
PCT Written Opinion of the International Searching Authority dated Apr. 4, 2019, for Application No. PCT/US2018/066813; 9 Pages.

(56) References Cited

OTHER PUBLICATIONS

Abou-Faycal, et al.; "Binary Adaptive Coded Pilot Symbol Assisted Modulation Over Rayleigh Fading Channels Without Feedback"; IEEE Transactions on Communications; vol. 53; No. 6; pp. 1036-1046; Jun. 2005; 11 Pages.

Akin, et al.; "Training Optimization for Gauss-Markov Rayleigh Fading Channels"; IEEE Communication Society; pp. 5999-6004; Jan. 2007; 6 Pages.

Anderson, et al.; "Optimal Filtering"; IEEE Transactions on Systems, Man, and Cybernetics; vol. SMC-12; No. 2; pp. 235-236; Mar./Apr. 1982; 2 Pages.

Arikan; "Channel Polarization: A Method for Constructing Capacity-Achieving Codes"; ISIT 2008; pp. 1173-1177; Jul. 6-11, 2008; 5 Pages.

Azar, et al.; "On the Equivalence Between Maximum Likelihood and Minimum Distance Decoding Binary Contagion and Queue-Based Channels with Memory;" IEEE Transactions on Communication; vol. 63; No. 1; Jan. 2011; 10 pages.

Chase, "A Class of Algorithms for Decoding Block Codes with Channel Measurement Information"; IEEE Transactions on Information Theory, vol. IT-18, No. 1; Jan. 1972; 13 Pages.

Duffy, et al., "Guessing Random Additive Noise Decoding with Symbol Reliability Information (SRGRAND)"; https://arxiv.org/; Nov. 25, 2019; 18 Pages.

Duffy, et al.; "Capacity-Achieving Guessing Random Additive Noise Decoding"; IEEE Transactions on Information Theory; vol. 65; No. 7; pp. 4023-4040; Jul. 2019; 21 Pages.

Duffy; "Ordered Reliability Guessing Random Additive Noise Decoding"; Oct. 4, 2020; 6 Pages.

Medard, et al.; "Bandwidth Scaling for Fading Multipath Channels"; IEEE Transactions on Information Theory; vol. 48; No. 4; pp. 840-851; Apr. 2002; 13 Pages.

Gallager; "A Perspective on Multiaccess Channels"; IEEE Transactions on Information Theory; vol. IT-31; No. 2; Mar. 1985; pp. 124-142; 19 Pages.

Kavcic, et al.; "The Viterbi Algorithm and Markov Noise Memory"; IEEE Transactions on Information Theory; vol. 46; No. 1; pp. 291-301; Jan. 1, 2000; 11 Pages.

Kaye, et al.; "Relationship Between LMS Compensators for Intersymbol Interference in Linear and Nonlinear Modulation Schemes"; IEEE Transactions on Information Theory; pp. 244-246; Mar. 1973; 3 Pages.

Li, et al.; "A Successive Decoding Strategy for Channels with Memory"; IEEE Transactions on Information Theory; vol. 53; Issue 2; Jan. 22, 2007; 5 Pages.

Li, et al.; "Approaching Capacity on Noncoherent Block Fading Channels with Successive Decoding"; IEEE ICC; pp. 1416-1420; Jan. 2006; 5 Pages.

Li, et al.; "Design and Analysis of Successive Decoding with Finite Levels for the Markov Channels"; May 5, 2009; 22 Pages.

Li, et al.; "Successive Decoding for Finite State Markov Modelled Flat Fading Channels"; ISIT 2006; Jul. 9-14, 2006; 5 Pages.

Liang, et al.; "Hardware Efficient and Low-Latency CA-SCL Decoder Based on Distributed Sorting"; Jan. 2016; 6 Pages.

Mani, "Symbol-Level Stochastic Chase Decoding of Reed-Solomon and BCH Code"; IEEE Transactions on Communications, vol. 67, No. 8, Aug. 2019; 12 Pages.

Narayanan, et al.; "A BCJR-DFE Based Receiver for Achieving Near Capacity Performance on Inter Symbol Interference Channels"; Jan. 2004; 10 Pages.

Nevat, et al.; "Channel Tracking Using Pruning for MIMO-OFDM Systems Over Gaus-Markov Channels"; ICASS; III-196-III-196; Jan. 2007; 4 Pages.

Niu, et al.; "CRC-Aided Decoding of Polar Codes"; IEEE Communications Letters; vol. 16; No. 10; pp. 1668-1671; Oct. 2012; 4 Pages.

Silverman et al.; "Coding for Constant-Data-Rate Systems"; IRE Professional Group on Information Theory, IEEE, vol. 4, No. 4; Sep. 1, 1954; 14 Pages.

Solomon, et al.; Soft-Maximum Likelihood Decoding Using GRAND; Jan. 9, 2020; 6 Pages.

Stimming, et al.; "LLR-Based Successive Cancellation List Decoding of Polar Codes"; IEEE Transactions on Signals Processing; vol. 63; No. 19; pp. 5165-5179; Oct. 1, 2015; 15 Pages.

Tal, et al.; "List Decoding of Polar Codes"; 2011 IEEE International Symposium on Information Theory Proceedings; pp. 1-5; Jan. 2011; 5 Pages.

Yang; "A Road to Future Broadband Wireless Access: MIMO-OFDM-Based Air Interface"; Wireless Communications in China: Technology vs. Markets; IEEE Communications Magazine; pp. 53-60; Jan. 2005; 8 Pages U.S. Request for Continued Examination for U.S. Appl. No. 17/202,860, filed Mar. 8, 2022; 3 Pages.

U.S. Non-Final Office Action dated Mar. 29, 2022 for U.S. Appl. No. 17/202,860; 11 Pages.

Response to U.S. Non-Final Office Action dated Mar. 29, 2022 for U.S. Appl. No. 17/202,860, filed Apr. 28, 2022; 9 Pages.

Notice of Allowance dated May 24, 2022 for U.S. Appl. No. 17/202,860; 9 Pages.

Campos; "Understanding the 5G NR Physical Layer"; Keysight Technologies; Nov. 1, 2017; 111 Pages.

Duffy, et al.; "Guessing noise, not code-words"; 2018 IEEE International Symposium on Information Theory (ISIT); Jun. 17-22, 2018; 5 Pages.

ETSI; "5G; NR; Physical layer procedures for control"; 3 GPP TS 38.213 version 15.2.0 Release 15; Jul. 2018; 101 Pages.

Author Unknown; "Lecture 8: Polar Codes"; Information Theory; Nov. 18, 2016; 41 Pages.

U.S. Non-Final Office Action dated Feb. 2, 2023, for U.S. Appl. No. 17/819,697; 18 Pages..

Response to Non-Final Office Action dated Feb. 2, 2023, and Terminal Disclaimer for U.S. Appl. No. 17/819,697, filed May 2, 2023; 8 Pages.

Response with Terminal Disclaimer to Non-Final Office Action dated Oct. 31, 2022, for U.S. Appl. No. 17/814,349; Response with Terminal Disclaimer filed Jan. 27, 2023; 5 Pages.

Secondary Preliminary Amendment dated Jan. 3, 2023, for U.S. Appl. No. 17/636,587; 4 Pages.

Notice of Allowance dated Mar. 22, 2023, for U.S. Appl. No. 17/636,587; 11 Pages.

PCT International Search Report and the Written Opinion dated Apr. 21, 2023, for International Application No. PCT/US2023/061153; 18 Pages.

Duffy et al.; "Quantized Guessing Random Additive Noice Decoding"; arXiv:2203.13552v2; Apr. 19, 2022; 6 Pages.

Duffy et al.; "Guessing random additive noise decoding with symbol reliability information (SRGRAND)"; arXiv:1902.03796v5; Aug. 23, 2021; 32 Pages.

Solomon et al.; "Soft Maximum Likelihood Decoding using GRAND"; ICC 2020-2020 IEEE International Conference on Communications (ICC); Jun. 7, 2020; 6 Pages.

\* cited by examiner

| Tag | Tags for reordering outputs of 3-stage pipeline |
|---|---|
| | Two bit tag for re-ordering |
| 00 | Tag showing no error in the codeword |
| 01 | Tag showing 1 or 2 bit error |
| 10 | Tag showing 3 bit error |
| 11 | Tag showing 4 or more bit error |

Fig. 15B

UNIVERSAL GUESSING RANDOM ADDITIVE NOISE DECODING (GRAND) DECODER

CROSS-REFERENCE TO RELATED APPLICATIONS

This application claims the benefit of and priority to U.S. Provisional Application entitled, "Universal Guessing Random Additive Noise Decoding (GRAND) Decoder," having Ser. No. 63/036,237, filed on Jun. 8, 2020, which is herein incorporated by reference in its entirety.

STATEMENT REGARDING FEDERALLY SPONSORED RESEARCH

This invention was made with government support under N6833518C0179 awarded by the Office of Naval Research (ONR). The government has certain rights in the invention.

BACKGROUND

Owing, at least in part, to the growth of networks, such as the Internet and the World Wide Web (commonly known as the Web), and the development and use of computing devices, such as mobile and wireless communication devices, these computing devices are being used to transmit and receive unprecedented amounts of data in the form of a stream of bits (or "bit stream"). Unfortunately, these communications are susceptible to various types of disturbances, such as noise in the transmission channels, poor signal strength or quality, interference from other devices which may be communicating simultaneously, or jamming, to provide some examples. Owing to these phenomena, the bits of data received by a receiver may be different than those transmitted by a sender. To ensure that the data is faithfully received by a receiver, different techniques, such as channel coding, which preserve the reproducibility of the data to some finite extent, are employed.

As is known, channel coding, also known as forward error control coding (FECC), involves adding redundant bits in a bit stream, such redundant bits are used by a receiver to correct errors introduced by the channel. As such, the added redundant bits allow the receiver to identify the originally transmitted bits. Examples of channel coding methodologies include Reed-Solomon codes (Reed and Solomon, 1960), Hadamard codes (Bell, 1966), and Hamming codes (Hamming, 1950).

SUMMARY

This Summary is provided to introduce a selection of concepts in simplified form that are further described below in the Detailed Description. This Summary is not intended to identify key or essential features or combinations of the claimed subject matter, nor is it intended to be used to limit the scope of the claimed subject matter.

In one aspect, described herein is an apparatus and technique for universal decoding.

In another aspect of the concepts described herein, described is a decoder for 5G and next generation wireless communication systems and related technologies. The described decoder has a modular decoder hardware architecture capable at implementing a decoding algorithm referred to as guessing random additive noise decoding (GRAND). A GRAND decoder is a universal decoder that is suitable for use on codes with moderate redundancy at different rates. Moderate redundancy means that the number of redundancy bits is such that computations, such as exploration of possible error patterns, based on a number of elements of the order of the number of redundancy bits, can be performed with acceptable complexity. The GRAND decoder is designed independently of any encoder owing to its dependency only on the noise, thus making it a universal maximum-likelihood (ML) decoder. Hence, the decoder architecture described herein is agnostic to any coding scheme. The GRAND decoder enables high efficiency through low energy per decoded bit for moderate redundancy codes while simultaneously providing shorter code lengths, higher rates, lower latency, lower than may be achieved with prior art approaches.

In embodiments, an integrated circuit (or "chip") is configured to operate in accordance with Guessing Random Additive Noise Decoding (GRAND) processing (and hence the chip is sometimes referred to as a "GRAND chip").

In accordance with one example embodiment provided to illustrate the broader concepts, structures, and techniques described herein, a method may include, by a decoder chip, demodulating a carrier signal to generate a received signal, generating a first error vector, inverting the effect of the first error vector from the received signal to generate a first codeword, and checking a codebook for the first codeword. The method also includes, responsive to the first codeword being a member of the codebook, identifying the first codeword as a resultant codeword and generating an information word based on the resultant codeword.

One way of characterizing membership is through the use of a syndrome. One way of checking pertinence via a syndrome is to have the codebook be characterized by a parity check matrix H that is based on a code length n and a supported code rate R. The method may include, by a decoder, demodulating a carrier signal to generate a received signal, computing the syndrome of the received signal, for example by multiplying by a parity check matrix H, generating a first error vector, computing the syndrome of the error vector, for example by multiplying by a parity check matrix H, and checking whether the syndrome of the received signal and the syndrome of the error vector are the same. The method also includes, responsive to the received signal's syndrome being equal to the error vector's syndrome, inverting the effect of the first error vector from the received signal to generate a first codeword, identifying the first codeword as a resultant codeword and generating an information word based on the resultant codeword.

In one aspect, the first error vector is an error vector with Hamming weight of zero, and other error vectors have weight of one and two.

In one aspect, the syndromes are generated based on a parity check matrix H.

In one aspect, the parity check matrix H is based on a code length n and a code rate R.

In one aspect, the method may also include, responsive to the received signal not being a member of the codebook, as determined by not having equality between the syndrome of the received signal and that of the first error vector, generating a second error vector, checking whether the syndrome of the second error vector matches the one of the received signal, and responsive to the received signal's syndrome being equal to the second error vector's syndrome, inverting the effect of the second error vector from the received signal to generate a codeword, identifying this codeword as a resultant codeword and generating an information word based on the resultant codeword.

In one aspect, the second error vector is an error vector with Hamming weight of one.

In one aspect, the first error vector and the second error vector are error vectors of a plurality of error vectors, the plurality of error vectors arranged in decreasing order of probability.

According to another illustrative embodiment provided to illustrate the broader concepts described herein, a method may include generating a syndrome of a channel output Y and, responsive to a determination that the syndrome is a zero vector, identifying the syndrome as a resultant codeword and generating an information word based on the resultant codeword. The method may also include, responsive to a determination that the syndrome is not a zero vector, generating an error vector and, responsive to a determination that a product of the error vector with a parity matrix H is equal to the syndrome, inverting the effect of such error vector from the channel output Y to obtain an expected codeword, identifying the expected codeword as a resultant codeword, and generating an information word based on the resultant codeword.

In one aspect, the first error vector is an error vector with Hamming weight of one and two.

In one aspect, the parity check matrix H is based on a code length n and a rate R.

In one aspect, the method may also include, responsive to a determination that a product of the first error vector with a parity matrix H is not equal to the syndrome, generating a second error vector and, responsive to a determination that a product of the second error vector with the parity matrix H is equal to the syndrome, inverting the effect of the second error vector from the channel output Y to obtain an expected codeword, identifying the expected codeword as a resultant codeword, and generating an information word based on the resultant codeword.

BRIEF DESCRIPTION OF THE DRAWINGS

The manner and process of making and using the disclosed embodiments may be appreciated by reference to the figures of the accompanying drawings. It should be appreciated that the components and structures illustrated in the figures are not necessarily to scale, emphasis instead being placed upon illustrating the principals of the concepts described herein. Like reference numerals designate corresponding parts throughout the different views. Furthermore, embodiments are illustrated by way of example and not limitation in the figures, in which:

FIG. 6 shows an example of a one bit flip pattern, in accordance with an embodiment of the present disclosure.

FIG. 7 shows an example of a two bit flip pattern, in accordance with an embodiment of the present disclosure.

FIG. 15B is a diagram illustrating tags for re-ordering outputs of a 3 stage pipeline, in accordance with an embodiment of the present disclosure.

DETAILED DESCRIPTION

Figure 1A:
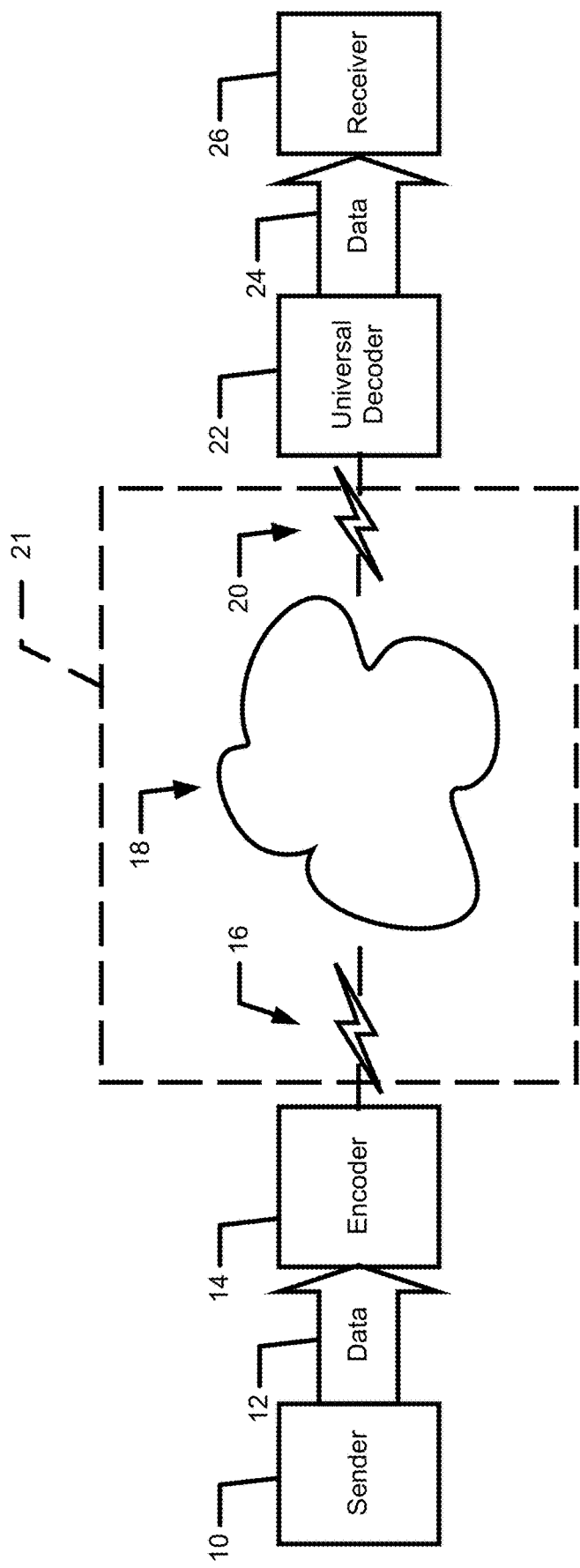
FIG. 1A is a block diagram of a system comprising a universal decoder in accordance with an embodiment of the present disclosure.

Referring now to FIG. 1A, shown is a system comprising a universal decoder in accordance with an embodiment of the present disclosure. In the example shown, a sender 10 provides information bits, which include data 12, to a receiver through a communication channel 21. The data is encoded by an encoder 14 and transmitted or otherwise provided over a signal path to an input of a universal decoder 22. Regardless of the particular make-up of the signal path between encoder 14 and decoder 22, the signal path is referred to herein as a channel 21. In this example channel 21 comprises one or more of a first wired or wireless channel 16, an internet 18 and a second wired or wireless channel 20.

The encoded data received at universal decoder 22 may include some noise or errors. Universal decoder 22 decodes the encoded data provided thereto and provides decoded data to a receiver 26 (e.g., a user, a software application or other appropriate entity). Decoder 22 performs detection on the received encoded data and outputs one or more bits in a codeword. With proper encoding and decoding, the information bits provided by the sender match the decoded bits provided to the receiver.

Although the example embodiment of FIG. 1 illustrates information bits provided through communication channel 21 to a receiver, in embodiments, it may be desirable to first provide the information bits to a storage system or other system rather than directly to communication channel 21. In this case, receiver 26 may request and retrieve the data from the storage or other system.

Figure 1B:
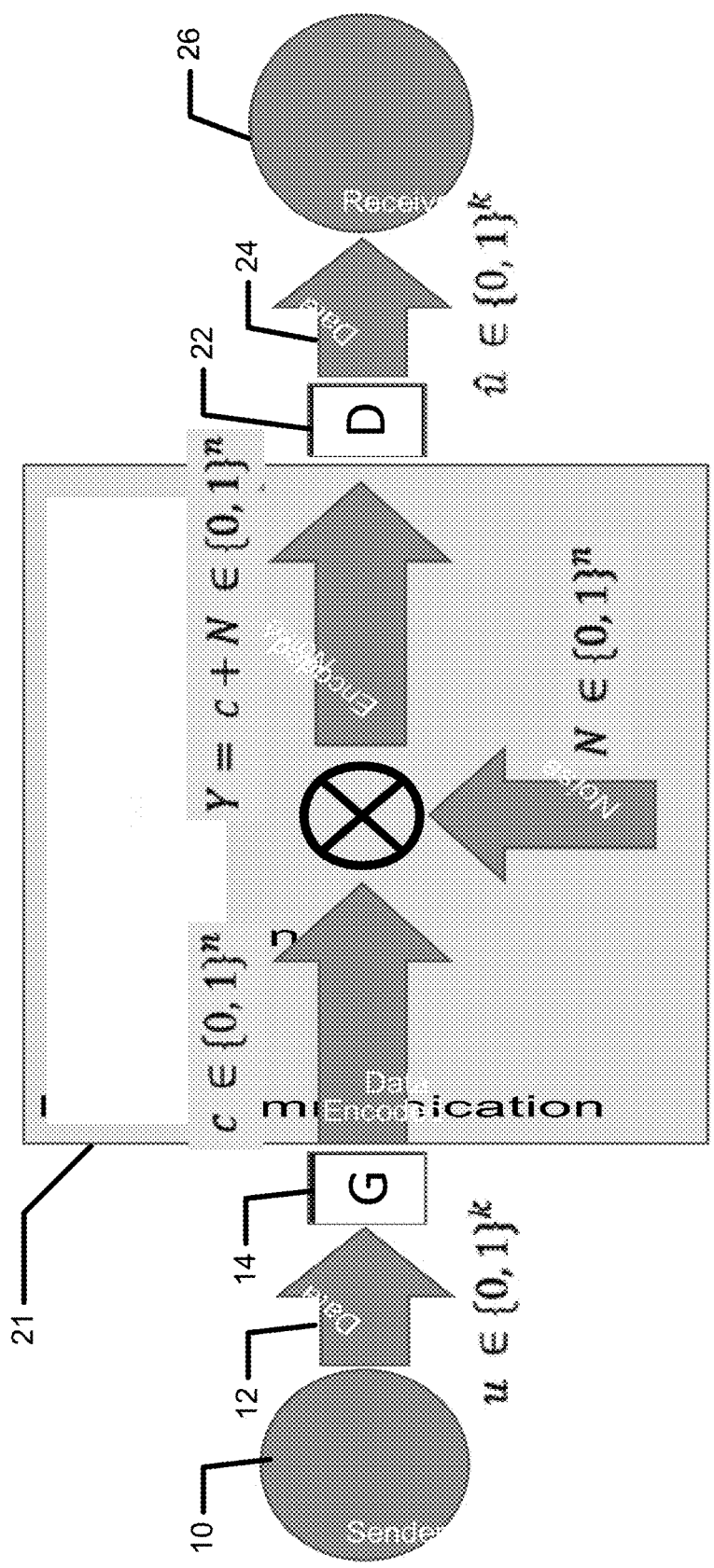
FIG. 1B is a block diagram of a data flow in an illustrative communication channel.

Referring now to FIG. 1B, shown is a diagram of a data flow in an illustrative communication channel 21. As shown, a sender 10 may transmit or otherwise send data to a receiver 26. Prior to transmission, the data 12 may be compressed into smaller data packets via source coding to generate a string of information, u, that is to be transmitted. For example, u may be a k bits wide string of information comprising symbols from an alphabet X. An encoder 14 (e.g., a generator matrix G) may then perform channel coding on these data packets (i.e., the string of information u) to add redundancy, generating a linear code, c. The added redundancy allows for error detection and correction at receiver 26. Thus channel coding techniques may be utilized to ensure that data transmitted by a sender is faithfully received by a receiver.

The set of all n bit wide vectors c is known as a codebook, C. Linear codes can be of two types: systematic codes and non-systematic codes. All codes that can be represented in the form c=[u, r] may be referred to as systematic codes, where u is a k bit wide string of information that is to be transmitted, and r is a string n−k bits wide, which is the redundancy added during the encoding process. All other codes which cannot be represented in the form c=[u, r] may be referred to as non-systematic codes.

As described previously, for data flow in communication channel 102 between sender 104 and receiver 106, sender 104 can compress the data to be transmitted into smaller packets through source coding. For example, letting the string of information to be transmitted by sender 104 u (where $u \in \{0, 1\}^k$) be the output of source coding, channel coding can be performed on these data packets (e.g., u) to add redundancy, which allows for error detection and correction at the receiver. The codeword c (where $c \in \{0, 1\}^n$) can then be modulated over a carrier signal and transmitted through communication channel 102 (e.g., a transmission channel), such as a wireless channel, for example. Since communication channel 102 is not perfect, some random channel noise E may get added to the transmitted codeword c. For example, E can be envisioned as another n bit wide vector (e.g., $E \in \{0, 1\}^n$) that gets added to the codeword, representing corruption observed in the data during transmission.

When the carrier signal is demodulated at receiver 106, receiver 106 may obtain the channel output Y=c+E, which is another n bit wide vector. To obtain the data that was transmitted by sender 104, the receiver can use or otherwise apply a channel decoding algorithm, for example, using a decoder 110, D, to decode the data received at the channel output. Applying such a channel decoding algorithm may produce the expected codeword ĉ, which is another n bit wide vector. The various redundancies that were added to the data during transmission make it possible to retrieve the transmitted data from the corrupted channel output.

Recovering a most likely information word, based on an observation of a noisy version of the codeword, is known to be a hard problem (NP-hard). As a result, codes are often co-designed with a decoding algorithm in mind. As a result, the majority of conventional codes (such as Reed-Mueller (RM) and Majority Logic, Cyclic-Redundancy-Check Assisted (CA) Successive Cancellation List (SCL) decoding for CA-Polar codes, Low Density Parity Check (LDPC), and Belief Propagation (BP), to provide a few examples) are co-designed along with a number of decoding schemes, which makes it necessary to change the decoder if the codes are to be changed. Since the codes need to be amenable to the decoding algorithms, they are limited in their construction.

With such conventional codes, only limited code rates are possible for different code lengths. The code rate R can be defined as the ratio of the number of information bits k to the code length n $$\left(\text{i.e., } R = \frac{k}{n}\right).$$

It should be noted that although research on codes with moderate redundancy may indicate support for all code lengths, the bounds of feasibility do not produce codes and associated decoders. At moderate redundancy code lengths, the choice for code rates goes below capacity. That is, such limited code rates may be below the channel capacity, which is defined as the maximum difference between the entropy of the input of the channel and the entropy of the input given the output. As a result, in order to achieve higher rates, conventional codes require longer code lengths.

In the example case of typical cellular communications in a $3^{rd}$ Generation Partnership Project (3GPP) fifth generation (5G) New Radio (NR) data channel, the bit error rate (BER), which is defined as the number of bit errors per unit time, generally ranges from $10^{-2}$ to $10^{-4}$. Assuming a Binary Symmetric Channel (BSC) model, which is defined as a channel capable of sending and receiving only one of the two symbols (0 or 1) with a crossover probability p, the channel capacity is of the order of 0.92 to 0.999. The capacity of the channel is given by $C=1-H_b(p)$, where $H_b$ is the binary entropy function. The 3GPP 5G NR data channel uses 3840-bit low-density parity-checks (LDPCs) with rates R as low as 0.2, and 8448-bit LDPCs with R between 0.33 to 0.91. In addition, to make the channels appear independently and identically distributed (IID), interleaving takes places over thousands of bits. Unfortunately, these schemes introduce latency while failing far short of achieving channel capacity.

In the case of a Maximum Likelihood (ML) decoding methodology, a received codeword x is compared to all the codewords in the codebook C. The codeword that is closest to the input codeword is chosen as the output codeword. Thus, an implementation of a channel decoder focuses on finding a match for the codeword received within the codebook. This approach inherently necessitates the knowledge of the encoding scheme for the decoder, hence their inter-dependency. To this end, the codebook C is first shared between the sender and the receiver. Also, note that searching the codebook for an input codeword is highly complex and computationally.

As used herein, n, k, R denote a linear code's length, dimension, and rate, respectively. G, H of a linear code denote the generator/parity check matrix (sometimes referred to herein more simply as a "parity matrix") of the linear code, respectively. u, c, y denote an information word, codeword, and channel output respectively. D denotes a decoding algorithm. The noise is denoted by N or E.

Concepts, devices, systems, and techniques are disclosed for a universal noise-centric channel decoder hardware (e.g. an integrated circuit or "chip") that implements a Guessing Random Additive Noise Decoding (GRAND) algorithm. As will be appreciated in light of this disclosure, a decoder chip (or more simply decoder) implementing GRAND, unlike conventional channel decoder, does not focus on finding a match for a received codeword in a codebook. Rather, the decoder implementing GRAND finds, identifies, or otherwise discovers, one or more errors that a codeword transmitted by a sender may have incurred during transmission from the sender to a receiver. This allows the decoder implementing GRAND to be agnostic to the encoding scheme since such a decoder can decode any type of linear codes using the GRAND algorithm. The decoder implementing GRAND is also capacity achieving with high probability when used with random or random linear codes.

In embodiments, a universal decoder that implements GRAND (sometimes referred to herein more simply as a "GRAND decoder") utilizes errors that may be incurred during transmission of the signal instead of finding the codewords in a codebook. To this end, in an embodiment, the GRAND decoder generates a series of possible noise sequences (also referred to herein as error vectors) in decreasing order of the probability of their occurrence. The error vectors are representations of the noise that may have been added into a codeword during transmission. The GRAND decoder subtracts these error vectors from a received channel output to generate an expected codeword.

The GRAND decoder checks whether the channel output minus a putative error vector is in the codebook. The first error vector that produces a member of the codebook is the resultant error vector, and the corresponding codeword is the channel output minus that error vector. This process as variously described herein can be referred to as ML decoding through noise guessing.

In embodiments, ML decoding through noise guessing assumes knowledge of the characteristics of the communication channel, such as a binary symmetric channel (BSC). Examples of such characteristics include, without limitation, the expected uncoded bit error rate (BER) and a model of the noise. Such characteristics may be determined via observance of the communication channel. For example, the communication channel characteristics may be needed for the GRAND decoder to determine the error vector sequences in their decreasing order of likelihood. Note that since the errors in the channel are not dependent on the codes being used, any type of linear codes can be used with the GRAND algorithm. The result is that the GRAND decoder is codebook agnostic and compatible with different coding schemes.

In embodiments, the GRAND decoder can determine a probability of having an error of Hamming weight i using the expression for n=128

$$P(i) = \binom{128}{i}(BER)^i(1-BER)^{128-i} \quad [1]$$

where BER is the uncoded BER of the channel. Table 1 shows the different Hamming weights of the errors along with the probability of occurrence in a BSC channel for different uncoded BER values.

TABLE 1

| Hamming weight | BER = $10^{-2}$ | BER = $10^{-3}$ | BER = $10^{-4}$ |
|---|---|---|---|
| 0 | 0.2762 | 0.8798 | 0.9872 |
| 1 | 0.3572 | 0.1127 | 0.0126 |
| 2 | 0.2291 | 0.0072 | $8.02 \times 10^{-5}$ |
| 3 | 0.0972 | 0.0003 | $3.37 \times 10^{-7}$ |
| 4 | 0.0306 | $9.42 \times 10^{-6}$ | $1.11 \times 10^{-9}$ |

Note that the computational complexity (i.e., average number of guesses made per received bit) of guessing the noise decreases as the rate is increased.

In embodiments, the GRAND decoder generates possible noise sequences in decreasing order of their likelihood. This provides for reduction in energy consumption.

In embodiments, the GRAND decoder achieves low latency in matrix-vector multiplications operations by exploiting sparsity of error vectors.

In embodiments, the GRAND decoder is time-interleaved with built-in security which switches between multiple parity check matrices (H) in real-time or quasi real-time. This enables re-randomization of the codebook for every codeword with minimal (and ideally zero) dead zone in decoding.

Encoder

An encoder component is responsible for preparing the information word for transmission over a noisy channel. This can include encoding the information word with an error-correcting code and modulating the codeword.

Channel

A codeword may be sent over a noisy channel, which corrupts some of the symbols of the codeword. Non-limiting examples of interesting channels include: a Binary Symmetric Channel (BSC), which is a channel that flips every bit with some probability, independently of other bits, an Additive White Gaussian Noise (AWGN) channel, which is a channel that adds Gaussian Noise independently to each modulated symbol, and a bursty channel, which is a channel that flips chunks of sequential bits.

Decoder

A channel output y may be decoded using GRAND (as will be further described below at least in conjunction with FIGS. 2-15). As will be further described herein, once a codeword is found, an information word can be retrieved.

In general overview, GRAND attempts to guess or postulate the additive noise added to a codeword sent over a channel (e.g., a noisy channel) in descending order of likelihoods. Membership of a codebook can be done using the parity matrix H. Once a codeword is found, the identified codeword is the most likely codeword. The attempt to find such a codeword can be abandoned after a predetermined number of guesses (GRANDAB).

In more detail, and in accordance with embodiments of the present disclosure, a GRAND decoder focuses on finding or otherwise discovering the error that may have been introduced during a transmission of a signal. In some such embodiments, the GRAND decoder can guess the error with high probability given the statistical characteristics of a channel. In an implementation, the GRAND decoder and, in particular, the GRAND algorithm, generates error vectors in the decreasing or approximate decreasing order of their probability. The GRAND decoder can perform parity checks to match against the value received. This provides the error that is introduced during transmission and allows the GRAND decoder to generate the expected codeword from the channel output.

For example, suppose c is the codeword that is sent by a sender to a receiver over a channel, and E is the noise that is added into it during transmission of the codeword. This provides Y=c⊕E as a channel output at the receiver. Suppose G is a generator matrix used to generate the codeword c and let H be its corresponding parity matrix. Multiplying both sides of the channel output above with parity matrix H provides HY=Hc⊕HE=HE, since Hc=0.

The GRAND decoder can utilize the channel noise characteristics to generate the noise sequence in decreasing order of the probability and can use the codebook membership as a hash to verify the error.

Figure 2:
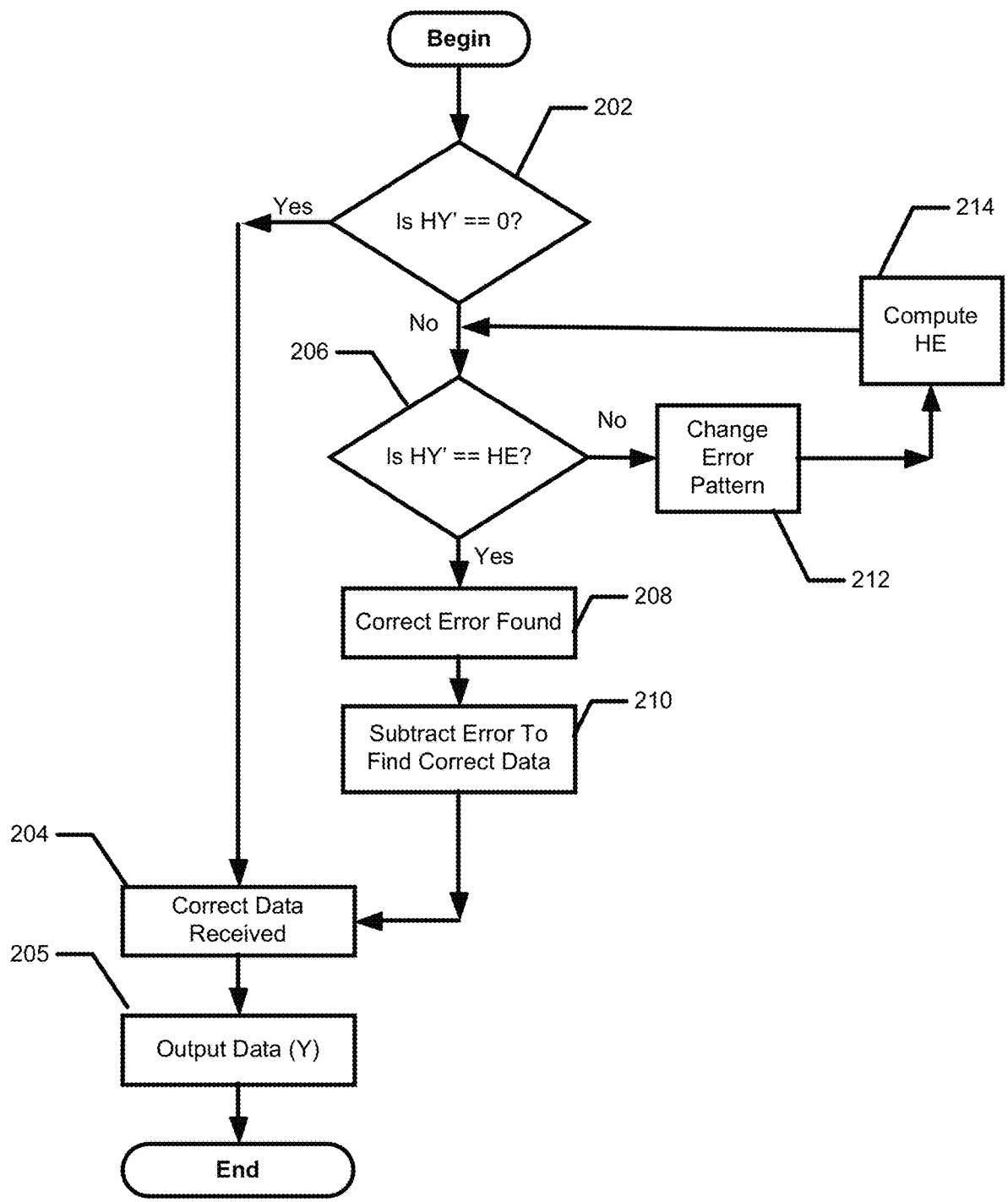
FIG. 2 is a flow diagram of an example process for Guessing Random Additive Noise Decoding (GRAND), in accordance with an embodiment of the present disclosure.

FIG. 2 is a flow diagram comprising a sequence of processing actions which form an illustrative embodiment of a process for decoding in accordance with the concepts described herein. It should be appreciated that, unless explicitly stated, the processing actions in the flow diagram are unordered meaning that the processing actions listed in the flow diagram may be performed in any convenient order.

Referring now to FIG. 2, an example process 200 for Guessing Random Additive Noise Decoding (GRAND), in accordance with an embodiment of the present disclosure. For example, a channel output, y, may be a 128-bit wide vector (code length n=128) that is passed to a syndrome calculator. The syndrome calculator can then multiply the channel output y with a parity matrix, H, to calculate a syndrome of the channel output HY. The dimensions of the parity check matrix H is based on a code length n and a minimum supported code rate R, and the dimensions can be given as (n–k)×n. For example, for a minimum supported code rate of 0.656, k=84, and the dimensions of parity matrix H are 44×128. Note that the syndrome is a zero vector if and only if the channel output is a member of the codebook. This implies that no error was introduced during the transmission and the correct codeword was received.

With reference to process 200, at 202, a syndrome HY (where H is a parity matrix and Y is a received codeword) is checked to determine whether it is a zero vector. If a determination is made that the syndrome HY is a zero vector, then, it can be determined that the output observed is compatible with no error being introduced during the transmission of data (e.g. during transmission of data 12 across channel 21 to decoder 22) and that the channel output y is the most likely codeword (i.e., the correct codeword insofar as the criterion of the decoder is concerned), for example, that was sent by a sender (e.g. sender 10 in FIGS. 1, 1A). Processing the proceeds to processing blocks 204, 205 and the output data Y is provided.

Otherwise, if a determination is made in decision block 202 that the syndrome HY is not a zero vector, this means that an error E exists and the syndrome HY is provided to a primary error generator. Details of a primary error generator will be described below at east in conjunction with FIGS. 3-5C. Suffice it here to say, however, that in embodiments, the primary error generator generates error vectors with Hamming weights of one and two. These error vectors may be considered the "easy" error patterns (e.g., those with 1 or 2 bit flips).

At decision block 206, a determination is made as to whether the syndrome HY is equal to the product of the error E and a parity matrix H (with the product denoted as HE). If a determination is made that the syndrome is equal to a product of the error and the parity matrix (i.e., HY'==HE), then, at 208, it can be determined that the error (i.e., a putative error) that was incurred during data transmission in a channel (e.g. channel 21) is found. Processing then proceeds to processing block 210 and the primary error generator can subtract the error from the channel output y to generate the expected codeword (i.e., the correct codeword) and processing proceeds to blocks 204, 205 as above).

Otherwise, if in decision block 206 a determination is made that the syndrome is not equal to the product of the error with the parity matrix (i.e., HY is not equal to HE), then, at processing block 212, the primary error generator passes the product (i.e., HE) to a secondary error generator and the error pattern is changed. In embodiments, the secondary error generator generates error vectors with a Hamming weight of three. These error vectors may be considered the more complex error patterns (e.g., those with 3 bit flips). These error vectors are the next error vectors in the sequence. The above described process (e.g., the processing based on the check of the syndrome HY against the product of the error with the parity matrix, HE, at 206) is repeated until the actual error is found or an abandonment criterion is satisfied. For example, the channel output may be abandoned if the Hamming weight of the error is greater than three. If the abandonment criterion is satisfied, an expectation is that the sender will retransmit the codeword.

Figure 3A:
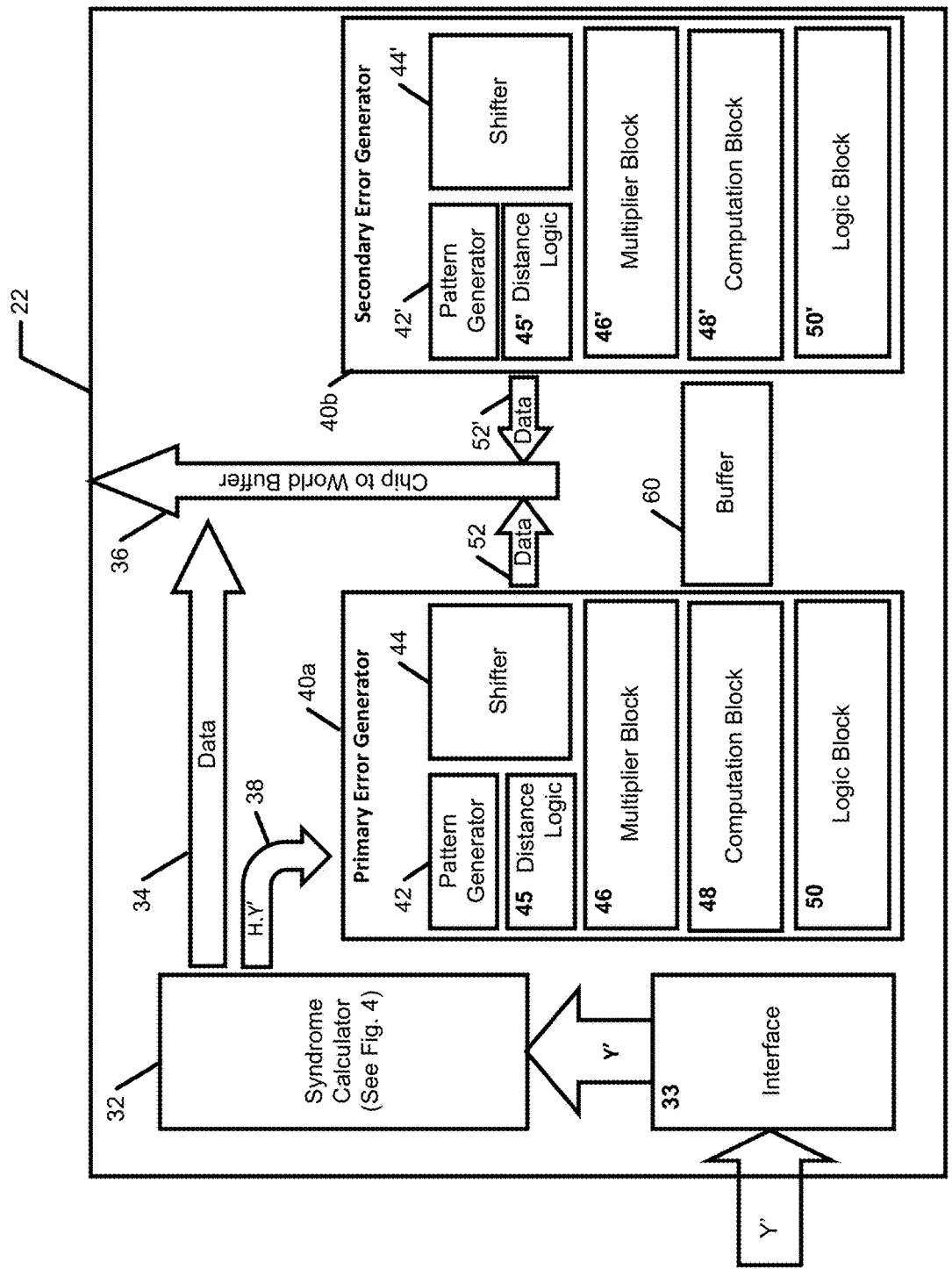
FIG. 3A is a block diagram of a universal decoder in accordance with an embodiment of the present disclosure.

FIG. 3A illustrates data flow through the various modules of a universal decoder chip 22' (or more simply decoder 22'), which may be the same as or similar to decoders 22 described above in conjunction with FIGS. 1A, 1B. Decoder 22' comprises an interface 33 through which data is received in decoder 22' and provided to (e.g. transmitted or otherwise communicated between) the various decoder components of FIG. 3A. In embodiments, the interface 33 may use separate dock and data lines, along with a select line to choose the particular component(s) for communication.

In operation, assuming a memory of a syndrome calculator 32 is already populated with a codebook, in response to a codeword Y' received by decoder 22' chip (i.e., a received codeword Y') the received codeword Y' is provided to the syndrome calculator 32. In response to the received codeword Y' provided thereto, syndrome calculator calculates or otherwise determines a syndrome. If the syndrome value is zero (0), then no error exists and the resultant codeword Y is sent or otherwise provided via signal path 34 to output buffer 36 That is, the decoder outputs a codeword corresponding to an expected codeword Y at an output thereof.

On the other hand, if the syndrome is non-zero, then there is an error present. From common channel statistics, it is known that as the number of bit flips increases, the probability of their occurrence generally decreases. With this consideration, data is provided to a primary error generator 40a where error weights of 1 and 2 are determined.

In embodiments, primary error generator 40a comprises a pattern generator 42a, distance logic 45a, a shifter 44a, a multiplier block 46a, a computation block 48a and a logic block 50a. Once errors E are determined, multiplier block performs a multiplication with a parity matrix H to generate a product HE. The product HE is compared against the H·Y' value. If the error is found, then the error is subtracted and the resultant codeword is sent to the output buffer via signal path 52a.

If the error is not found, then a secondary error generator is engaged (i.e. the primary error generator 40a passes the product (i.e., HE) to the secondary error generator 40b e.g., via a buffer or other means 60). Secondary error generator 40b comprises a pattern generator 42b, distance logic 45b, a shifter 44b, a multiplier block 46b, a computation block 48b and a logic block 50b. The secondary error generator receives the product (i.e., HE) from the primary error generator and the secondary error generator changes the error pattern. In embodiments, the secondary error generator may generate error vectors with a Hamming weight of three. As noted above in conjunction with FIG. 2, these error vectors may be considered the "hard" error patterns (e.g., those with 3 bit flips). These error vectors are the next error vectors in the sequence. The primary and secondary error generator operate until the actual error is found or an abandonment criterion is satisfied. If the error is found, then the error effect is inverted and the resultant codeword is sent to output FIFO via signal path 52b.

Alternatively, the channel output may be abandoned if the Hamming weight of the error is greater than three. As noted above, if the abandonment criterion is satisfied, an expectation is that the sender will retransmit the codeword.

It should be appreciated that, in operation, syndrome calculator 32 is not idle but rather keeps receiving new codewords and in response thereto generates an output which is provided to the output FIFO.

Pipelining and Dynamic Clock Gating of Error Generators

Figure 3B:
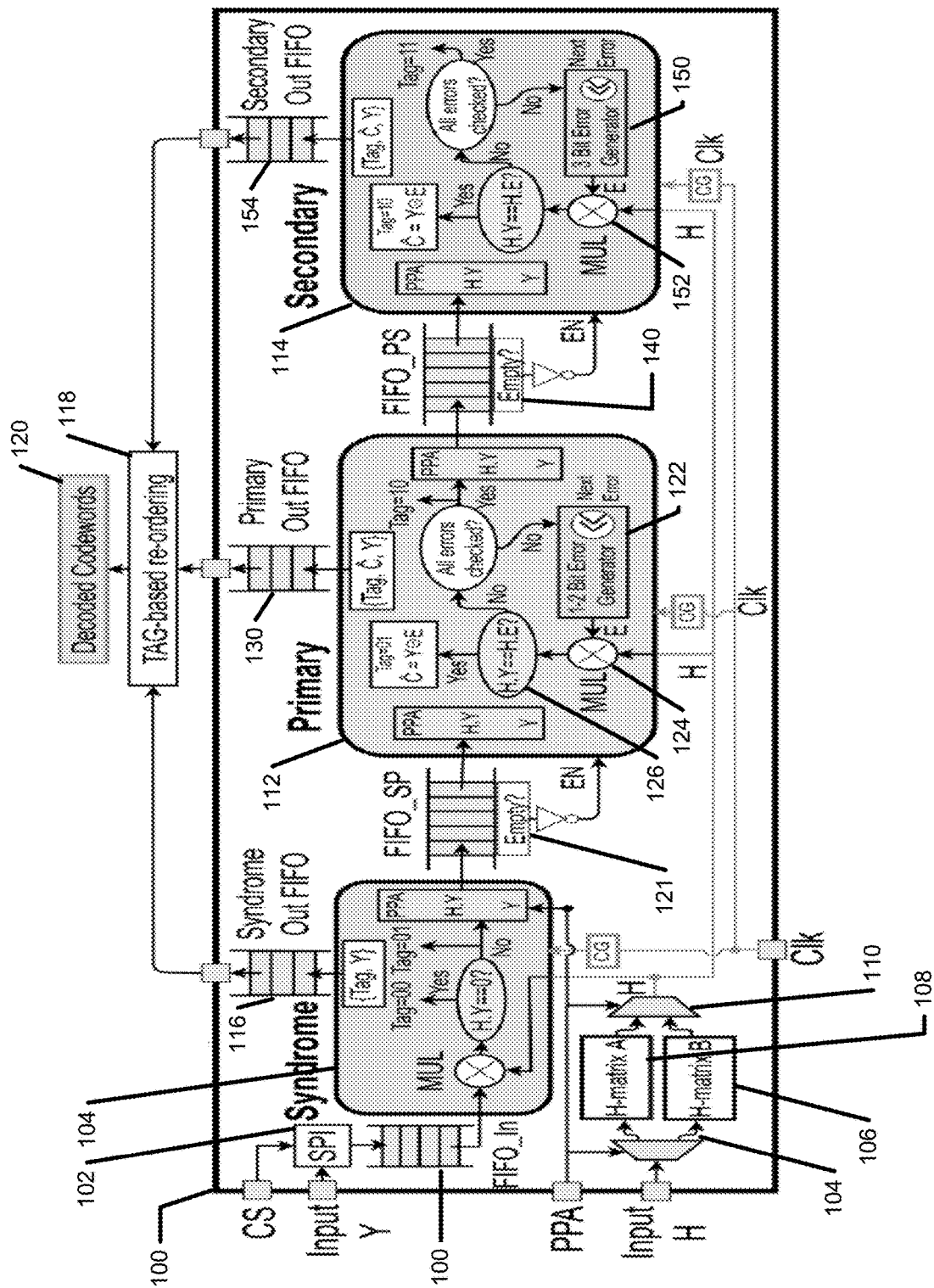
FIG. 3B is a block diagram of a universal decoder in accordance with an embodiment of the present disclosure.

FIG. 3B illustrates data flow through a universal decoder chip 100 (or more simply decoder 100) using pipelining and dynamic clock gating of error generators. In embodiments, decoder 100 may be the same as or similar to decoders 22 described above in conjunction with FIGS. 1A, 1B and 3.

Decoder 100 comprises an interface 102 through which data Y is received in decoder 100 and provided to (e.g., transmitted or otherwise communicated between) the various decoder components illustrated in FIG. 3A. In this illustrative embodiment, the interface 102 is provided as an SPI. Decoder 100 also receives parity matrix data H via an a first multiplexor 104 which selectively directs the parity matrix data to one of two matrix memories 106, 108 (respectively, denoted H-matrix A and H-matrix B in FIG. 3A). Matrix memories 106, 108 are coupled to a second multiplexor 110 which selectively directs the parity matrix data to the syndrome 104 as well as to a primary error generator (EG) 112 and a secondary EG 114. Thus, muxes 104,110 and memories 106, 108 establish at least a portion of a structure technique for parallelized and pipelined operation to process data.

Briefly, decoder 100 utilizes pipelining to increase the throughput. In this example embodiment, three-stage pipelining is utilized (i.e., pipelining to the syndrome 104, primary EG 112 and secondary EG 114) to increase the throughput).

In one example embodiment, throughput may be increased by 1.7× or more for a channel bit flip probability (p) on the order of $10^{-3}$.

Data propagates through the SPI to an input memory (here illustrated as an input FIFO memory) and is provided to a syndrome calculator 32. Syndrome calculator 32 checks for codebook membership and an error generator (EG) 40 for calculating rank-ordered binary symmetric channel noise patterns with 1 to 3-bit flips, and checking for membership by querying the codebook. In this example embodiment, EG 40 comprises primary and secondary EGs 40a, 40b checking 2 and 16 errors in parallel and thereby achieving two times (2×) and sixteen times (16×) reduction in latency.

Decoder 100 leverages the noise statistics to optimize the energy per decoded bit by dynamic clock gating of the EGs 112, 114 based on the probability of error likelihood.

For example, for n=128 bits and p=$10^{-3}$, 88% of the codewords have no errors, 11.99% of them have 1- or 2-bit flips and, only 0.03% of them have 3-bit flips. Thus, in this example, the secondary EG 40b remains active only for 0.03% of the decoding, thereby reducing the average power and enabling 8.4× energy savings. It should, of course, be appreciated that Improvements are also gained in applications which utilize a different number of bits (e.g. n=265, 512, 1024, etc. . . . ) as well as for different channel bit flip probabilities. Thus, the described techniques find application in a wide variety of different applications.

In operation, assuming syndrome calculator 104 is already populated with a codebook (e.g. a memory of the syndrome calculator populated with a codebook), in response to a codeword Y input received by decoder 100 (i.e., a received codeword Y) the received codeword Y is provided to the syndrome calculator 104. In response to the received codeword Y provided thereto, the syndrome calculator calculates or otherwise determines a syndrome. If the syndrome value is zero (0), then no error exists and the resultant codeword Y is sent or otherwise provided to an output of the decoder. In this example embodiment, the syndrome is output via a syndrome output buffer 116 (illustrated as a first-in, first-out (FIFO) buffer 116 in the example embodiment of FIG. 3A).

For reasons which will become apparent from the description provided herein below, processing times of the syndrome 104 and primary and secondary EGs 112, 114 can result in out-of-order decoded codewords. It is thus necessary to re-order the out-of-order decoded codewords before outputting decoded codewords. Accordingly, the resultant codeword Y from syndrome 104 is provided to syndrome output buffer 116 and subsequently provided to a tag-based re-ordering system 118 which re-orders out-of-order decoded codewords and provides decoded codewords 120.

In embodiments, tag-based re-ordering system 118 may be provided as part of a decoder integrated circuit (e.g. decoder 100). In embodiments, tag-based re-ordering system 118 may be an off-chip component (e.g., not provided as part of a decoder integrated circuit) in which case the decoder chip outputs a decoded code word which may then be provided to a separate processing circuit (i.e. separate from the decoder chip) which performs the processing necessary to re-order out-of-order decoded codewords.

In one example embodiment, out-of-order decoded codewords may be re-ordered using a two-bit tag for successful information recovery. Tag-based reordering is described below in conjunction with FIGS. 15A, 15B. It should be appreciated, of course, that other re-ordering techniques (i.e. other that tag-based reordering) may also be used.

If the syndrome is non-zero, then there is an error present. As noted above, from channel statistics, it is known that as the number of bit flips increases, the probability of their occurrence generally decreases. With this consideration, data is provided from syndrome 104 through a buffer 121 (here illustrated as a FIFO) to primary EG 112 where error weights of 1 and 2 can be determined.

In embodiments, primary error generator 112 comprises a pattern generator 122, distance logic, a shifter, a multiplier 124, a computation block and logic.

Once errors E are determined or otherwise provided by error generator 122, multiplier 124 performs a multiplication between the error values E and values of a parity matrix H to generate a product H·E. The product H·E is compared against the product H·Y as illustrated in 126. If the error is found, then the error is subtracted (e.g., compensated or otherwise removed) and the resultant codeword is sent to a primary output 130 (illustrated as a first-in, first-out (FIFO) buffer 130 in the example embodiment of FIG. 3A) and subsequently to tag-based re-ordering system 118 as above.

If the error is not found in primary EG 112, then data (e.g. product H·E) is provided from primary EG 112 through a buffer 140 (here illustrated as a FIFO) to secondary EG 114.

Secondary error generator 114 comprises a pattern generator 150, distance logic, a shifter, a multiplier block 152, a computation block and logic. The secondary error generator 114 receives the product (i.e., H·E) from the primary error generator 40a and the secondary error generator changes the error pattern.

In embodiments, the secondary error generator 114 may generate error vectors with a Hamming weight of three. As noted above in conjunction with FIG. 2, these error vectors may be considered the "hard" error patterns (e.g., those with 3 bit flips). These error vectors are the next error vectors in the sequence. The primary and secondary error generator operate until the actual error is found or an abandonment criterion is satisfied. If the error is found, then the error effect is inverted (e.g., subtracted, compensated or removed) and the resultant codeword is sent to a primary output 154 (illustrated as a first-in, first-out (FIFO) buffer in the example embodiment of FIG. 3A) and subsequently to tag-based re-ordering system 118 as above.

Alternatively, if the secondary error generator 114 cannot determine the error the channel output may be abandoned. For example, in embodiments, if the Hamming weight of the error is greater than three the channel output may be abandoned. As noted above, if the abandonment criterion is satisfied, an expectation is that the sender will retransmit the codeword.

It should be appreciated that, in operation, syndrome calculator 104 is not idle but rather keeps receiving new codewords and in response thereto generates outputs for processing in accordance with the above-described techniques.

Figure 4:
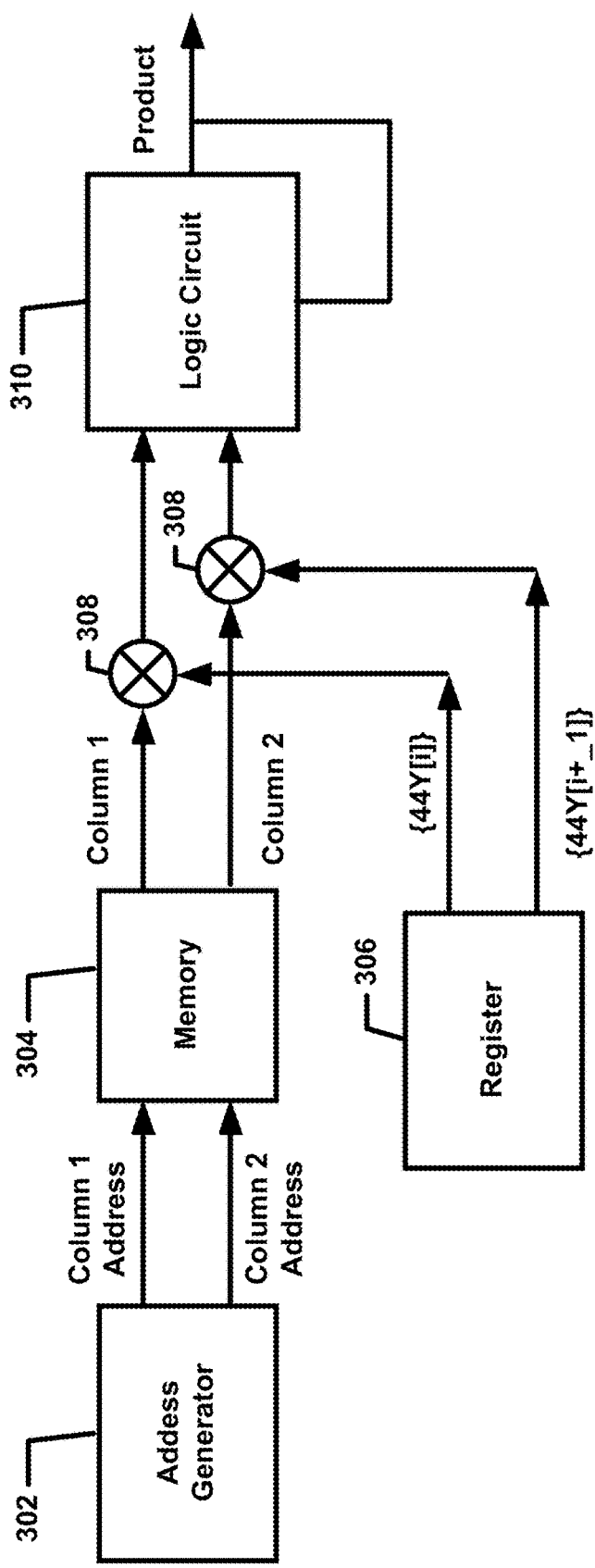
FIG. 4 is a block diagram of illustrates an example syndrome calculator, in accordance with an embodiment of the present disclosure.

FIG. 4 illustrates an example syndrome calculator 300, in accordance with an embodiment of the present disclosure. As described previously, syndrome calculator 300 may calculate a syndrome (e.g., HY) of a channel output (e.g., y) by multiplying the channel output with a parity matrix (e.g., H). As shown, syndrome calculator 300 includes an address generator 302, a memory 304, a register 306, a register 306, multiplication logic 308, and logic circuit 310 for logically following the inputs provided thereto to provide a syndrome. In an example implementation, address generator 302 may be implemented as a finite state machine (FSM) configured to generate addresses of two columns (e.g., column address 1 and column address 2 as shown in FIG. 4) of the parity matrix H and memory 304 can be provided as a dual-port static random access memory (DPSRAM) and logic circuit 310 can be an XOR logic circuit.

As shown in the example embodiment of FIG. 4, the addresses of the two columns output from address generator 302 are input to DPSRAM 304, which generates two columns of the parity matrix H. The two columns of the parity matrix output from DPSRAM 304 are then multiplied (see reference numeral 308 in FIG. 4) with two elements of the Y vector output from register 306. The output from the multiplication logic is the syndrome value. The product of the two columns of the parity matrix and the two elements of the Y vector (i.e., the outputs from multiplication logic 308) are then bitwise compared, where that comparison may be effected through the use of XORing (see reference numeral 310 in FIG. 4) to determine whether the syndrome is a zero vector. The above process is repeated until the parity matrix H is exhausted (i.e., all the columns of the parity matrix are processed). If the syndrome is a zero vector (i.e., no error was introduced during the transmission and that the channel output y is the codeword), the syndrome is sent to the output as the codeword. Otherwise, the syndrome is sent to a primary error generator to find or otherwise discover the errors.

Figure 5A:
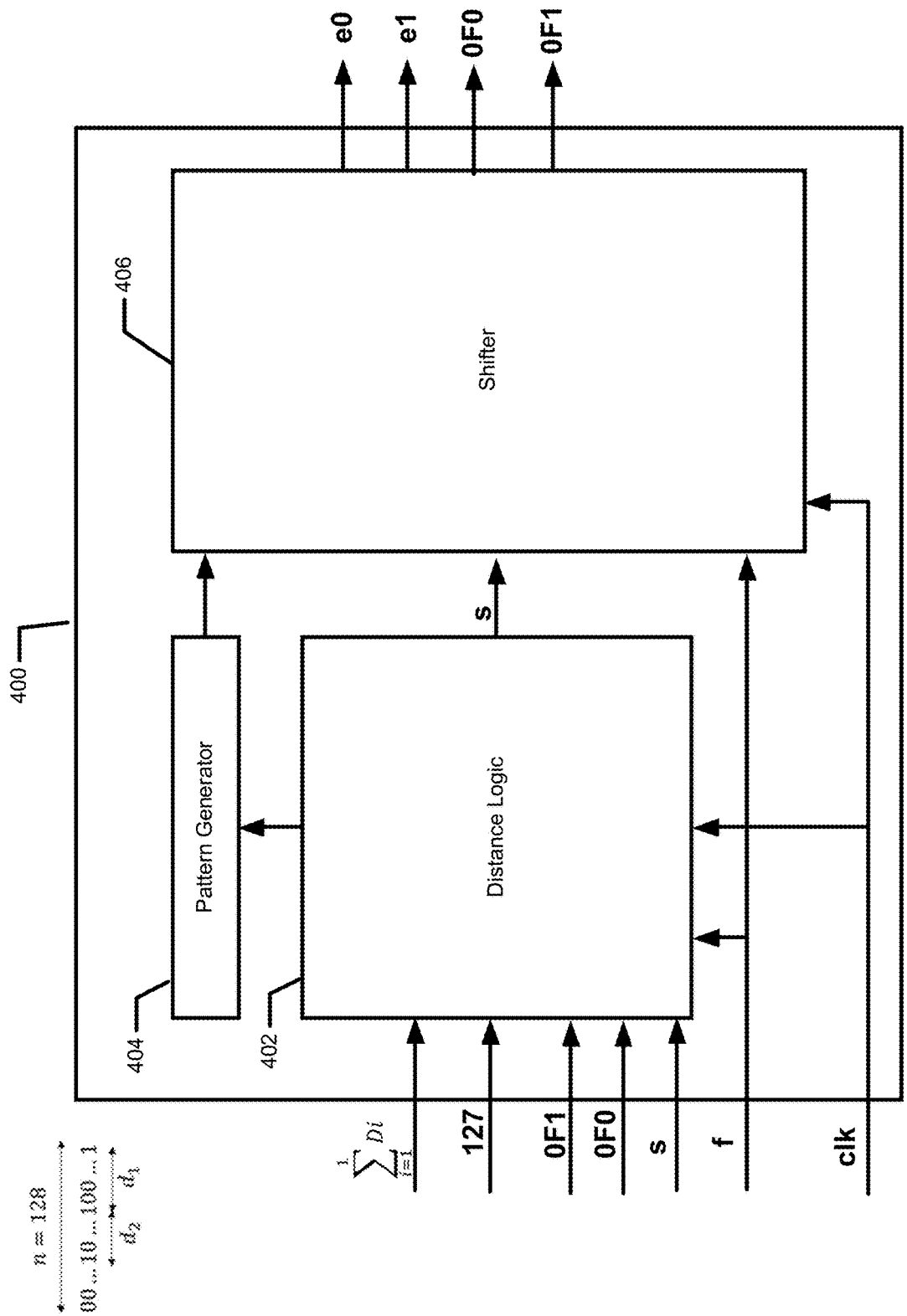
FIG. 5A is a block diagram of an example primary error generator, in accordance with an embodiment of the present disclosure.

FIG. 5A illustrates an example error generator 400 comprising a distance logic circuit 402 (or more simply distance logic 402) which generates distance pairs (D1, D2), a pattern generator 404 whish uses the distance pairs (D1, D2) to generate a pattern using an arithmetic formula and a shifter module (or more simply shifter) 406 which receives a pattern provided thereto and logically shifts the N bit value (e.g., a 128 bit value) by t bits. The choice of t depends on the channel model, or can it depend on the level of parallelization, or on both.

As illustrated in FIG. 3, it is appreciated that embodiments comprise two different modules in the form of primary and secondary error modules (e.g. primary and secondary error modules 40, 40' in FIG. 3) and thus the error generator is slightly different for both the cases. It should thus be appreciated that the example of FIG. 5A depicts the general Idea of the error generator functionality.

As described previously, error generator 400 sequentially generates different patterns. In embodiments, primary error generator 400 may generate error vectors with Hamming weights of one and two. The error vectors (error sequences) may be generated based on their decreasing order of their likelihood of occurrence.

Error generator 400 also includes abandon logic which determines the terminating condition of the various error weights.

In brief, shifter module 406 and the combination of distance logic 402 and pattern generator 404 can be thought of as a producer-consumer system where pattern generator 404 is responsible for producing new patterns, while shifter module 406 is responsible for writing to a registers, reg$_{d_i}$, (FIG. 5C) all the t-shifts of a given pattern. As will be further described below, a t-shift of a vector is essentially the vector shifted by t bits. Whenever shifter module 406 completes shifting a pattern, shifter module 406 fetches the next pattern from pattern generator 404. Upon receiving the signal from shifter module 406, distance logic 402 updates the next distances, and pattern generator 404 produces a next error pattern and sends it to shifter module 406. Note that error generator 400 is responsible for generating errors only and not for checking membership in the codebook. Thus, error generator 400 does not know (i.e., has no knowledge of) when a codeword is found. As a result, an outside signal (e.g., a signal f in FIGS. 5A, 5C and 10) is utilized to inform error generator 400 (i.e., both distance logic 402 and shifter module 404 of error generator 400) of when error generator 400 needs to be reset (for example, when a codeword was found).

Figure 5C:
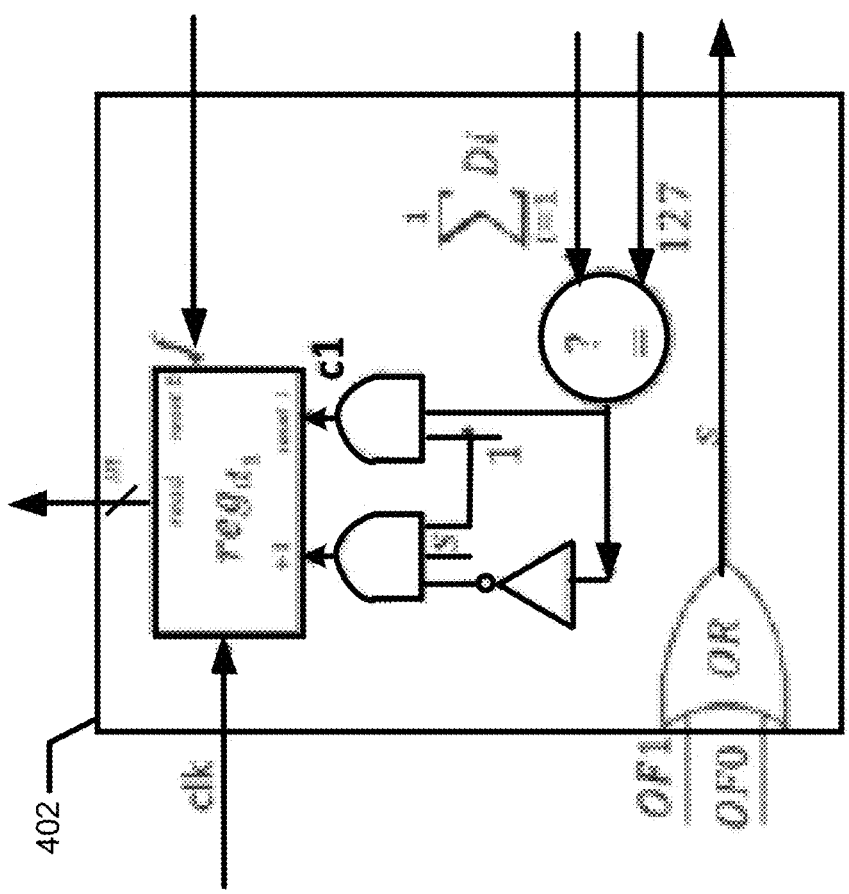
FIG. 5C is an example distance logic circuit of the primary error generator of FIG. 4, in accordance with an embodiment of the present disclosure.

In more detail and with reference to FIG. 5C, distance logic 402 is configured to update the distance between the 1's in the next generated pattern. That is, distance logic 402 is responsible for generating patterns with different distances between the 1's. In operation, whenever shifter module 406 is done shifting a pattern, an overflow signal, s, is sent to distance logic 402, which indicates that distance logic 402 needs to update the distances between the 1's of the next pattern. The following provides an example pseudo code for distance logic 402:

| | |
|---|---|
| 1) | If received f signal: reset distance logic registers. |
| 2) | Else: when "Finished pattern" s signal is received: |
| 3) | Update all registers for the next pattern. |

Figure 5B:
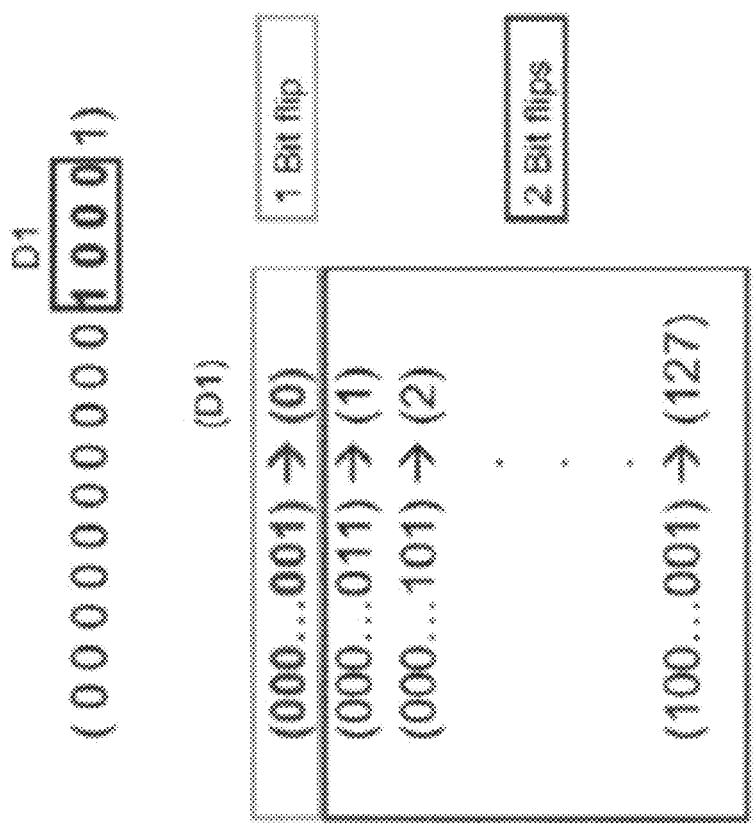
FIG. 5B is an example of error vectors mapping to distance pairs.

For instance, in an example case of a Binary Symmetric Channel (BSC), as shown in FIG. 5B, an emerging pattern may be observed when the expected error patterns are arranged in order of decreasing probability. As can be seen in FIG. 5B, D1 may refer to the number of bits between two consecutive high bits (with the higher significant bit included), and the value of D1 increases with the decreasing probability of the expected error patterns. In an implementation, distance logic 402 may be realized as one or more counters. In such implementations, distance logic 402 can increment the value of D1 each time an overflow condition is satisfied (i.e., each time distance logic 402 approaches the overflow condition), where the overflow condition is defined as the most significant bit (MSB) of the error vector being high. In the example shown in FIG. 5A, as there is only one bit flip, the first error pattern is the seed pattern to be used by the error shifter module (e.g., shifter module 406), which corresponds to a D1 value of 0.

It will be understood that distance logic 402 may be modified depending on the communication channel. For instance, for a bursty channel model (e.g., a model in which the channel flips a number of consequent bits with some probability), distance logic 402 can be altered to have a distance of 1 between adjacent 1's, and the number of 1's would increase whenever an overflow signal, s, is received. Also note that, while a distance logic component for two different channel models is described, it will be appreciated in light of this disclosure that other distance logic can be implemented.

Referring again to FIG. 5A, pattern generator 404 is configured to feed or otherwise provide new error patterns to shifter module 406, every time shifter module 406 needs a new error pattern to shift. To this end, pattern generator 404 receives the distances between 1's from distance logic 402 and generates the addresses of the 1's in the new pattern that is fed or otherwise provided to shifter module 406. That is, pattern generator 404 receives as input the value of D1 from distance logic 402 and generates the input seed pattern for shifter module 406. The following provides an example pseudo code for pattern generator 404:

1) Generate Addresses of 1's in the Next Pattern.

Figures 6, 7:
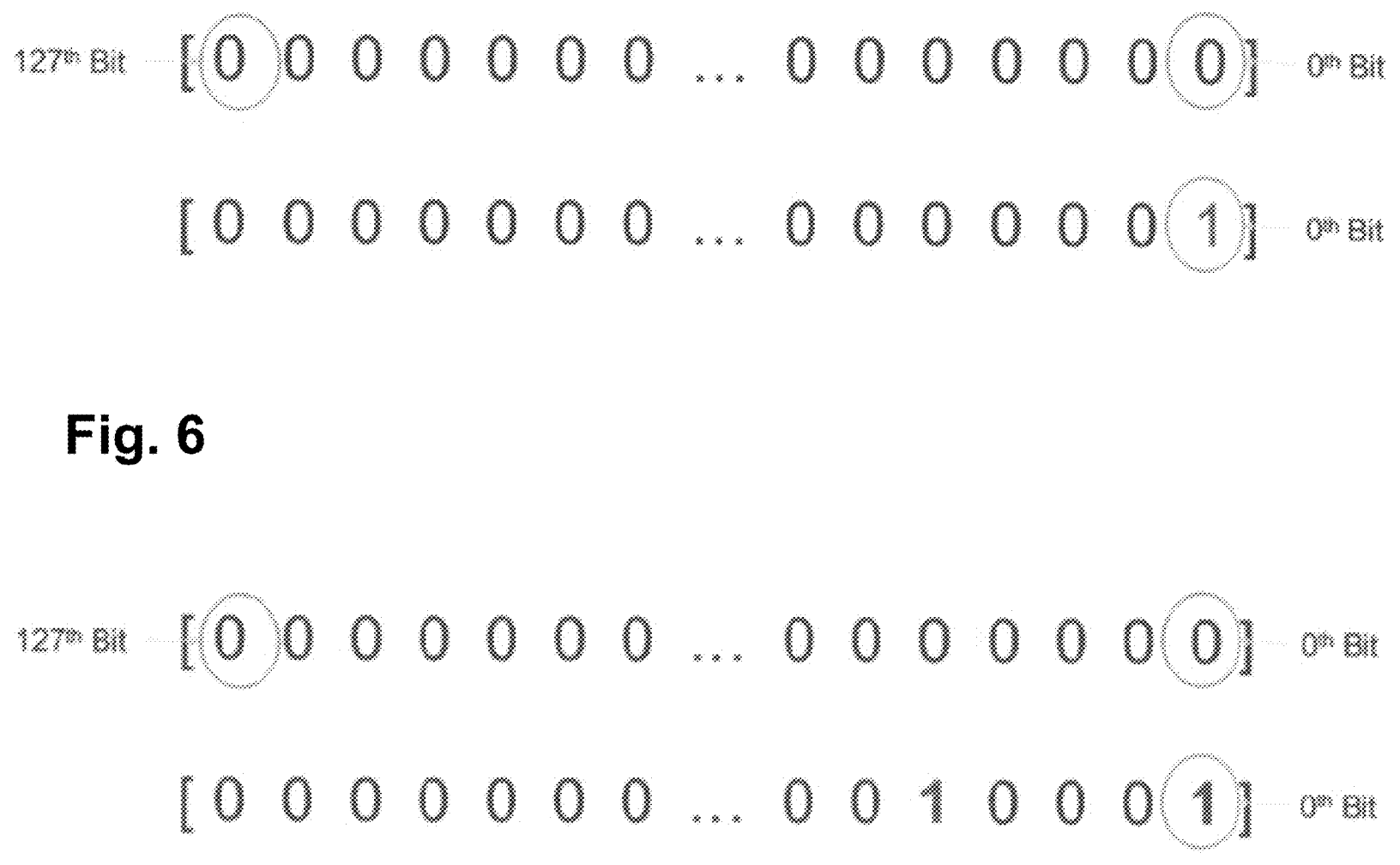

For instance, as shown in FIG. 6, pattern generator 404 may generate pointers to the indices which have bit values of 1. As can be seen in the one bit flip example of FIG. 6, on the basis of D1, pattern generator 404 (FIG. 5A) may generate a one bit flip pattern, 16'h80_00. In the generated vector, 00 refers to the high bit at index 0 and corresponds to the first bit flip. Since there is just one error in this example, only one pointer is needed. However, since pattern generator 404 may generate error vectors having weight (e.g., Hamming weight) of two, pattern generator 404 needs another value to point to the other high bit when necessary MM: Is this clear?. When that other value is not needed, pattern generator 404 may generate a null value of 80, which is ignored in the later processing stages.

As shown in FIG. 7, pattern generator 404 may also generate a two bit flip pattern, 16'h04_00, on the basis of D1. In the generated vector, 00 refers to the high bit at index 0 and corresponds to the first bit flip, and 04 refers to the high bit at index 4 and corresponds to the second bit flip.

Referring again to FIG. 5A, shifter module 406 is configured to receive as input the seed pattern from pattern generator 404 and cyclically shift the pattern towards the most significant bit. This essentially performs a Logical Shift Left (LSL) operation on the vector. In operation, shifter module 406 receives the indices of the active high bits. Thus, to perform an LSL operation, shifter module 406 adds 1 to the existing values of the indices. In embodiments, shifter module 406 may be capable of generating as many as 16 error vectors at the same time, in each clock cycle, which allows for parallelized operation. The following provides an example pseudo code for shifter module 406:

1) If received f signal: reset the shifter module.
2) Else: Let e0 be the read value of the bottom MUX (e.g., refer to FIG. 12).
3) Shift e by i units and output ei.
4) If one of the shifts overflows or results in the zero string (further described below):
    Signal "Finish pattern" s to the pattern generator.

Shifter module 406 is also configured to generate the overflow signals. As described previously, an overflow may be defined as the condition in which the MSB of the error vector goes high. This condition is chosen since a further LSL operation on the vector will reduce the number of high bits in the vector, thereby changing its weight (e.g., Hamming weight). Shifter module 406 may collectively send the overflow signals to distance logic 402, where a bitwise OR operation is performed on all the overflow values. The result is used to increment the counter for D1, to generate the next seed pattern.

Figure 8:
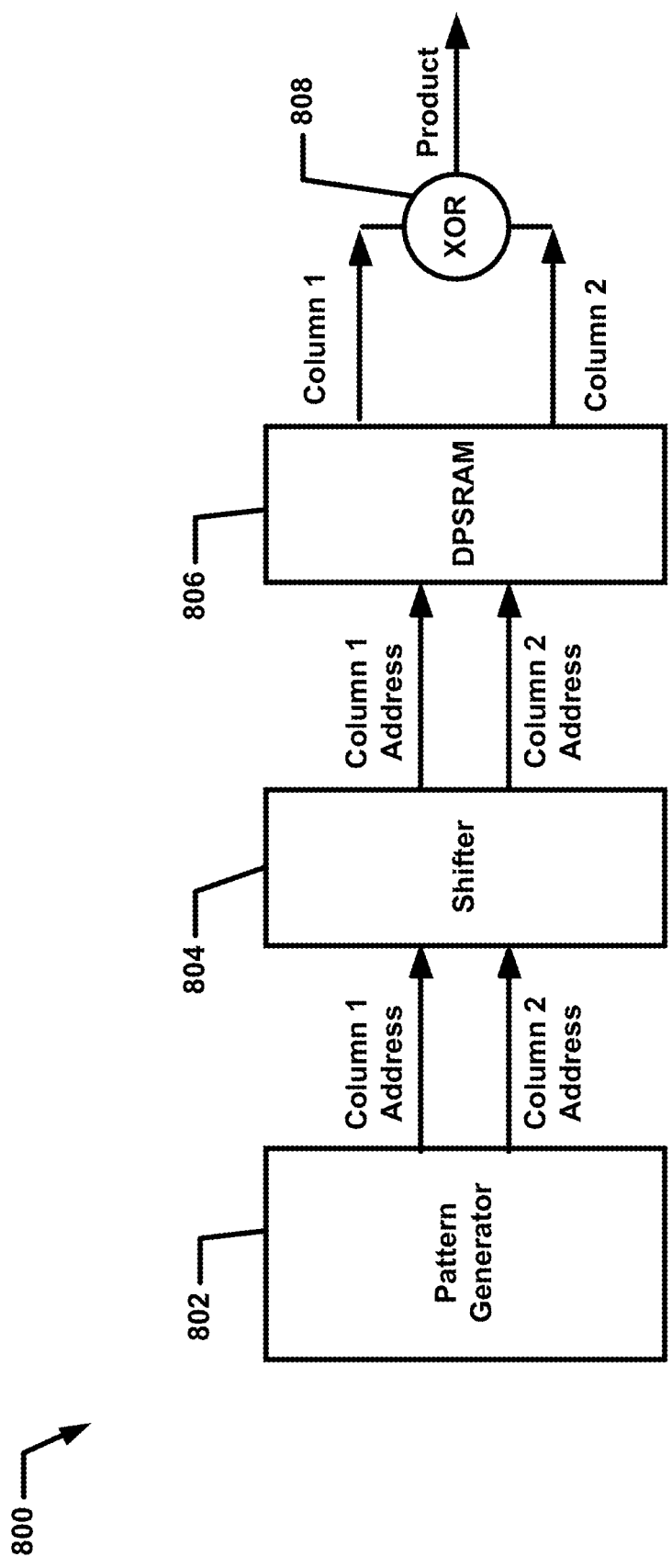
FIG. 8 is a block diagram of an example multiplication module of a primary error generator, in accordance with an embodiment of the present disclosure.

FIG. 8 illustrates an example multiplication module 800 of a primary error generator, in accordance with an embodiment of the present disclosure. In particular, the example multiplication module 800 is implemented using dual port SRAM. The dual port SRAM allows for accessing two memory locations at once through its two access ports. This enables a primary error generator (e.g. primary error generator 40 in FIG. 3) to obtain two columns of the parity matrix H each clock cycle.

In an embodiment, as shown in FIG. 8, instead of generating binary values from a pattern generator (see reference numeral 802 in FIG. 8), the pattern generator generates three decimal values which signify the positions of '1' in the error vector. The outputs from the pattern generator (i.e., the column addresses) are provided as inputs to a shifter (see reference numeral 804 in FIG. 8), which is incremented by one in each step. The outputs from the shifter are provided as inputs to a DPSRAM (see reference numeral 806 in FIG. 8), where the respective column is obtained. The outputs from the DPSRAM are then XORed (see reference numeral 808 in FIG. 8) and a final product is obtained.

Note that the index values generated in a primary error generator operate as the column selectors in multiplication module 800 by serving as column addresses for selection. The DPSRAM is used to store the parity matrix H. The two column values received are XORed together, which generates the HE product. The HE product is then compared to the syndrome value. If the HE product is equal to the syndrome value, the primary error generator subtracts this error value from the channel output to obtain the expected codeword. Since the primary error generator at most generates the error with two bit flips, only a single DPSRAM is needed, which allows for two reads in one clock cycle. This allows for the calculation to be performed at a very low latency of one clock cycle.

As described previously, if the primary error generator (e.g., primary error generator 40 in FIG. 3) exhausts all possible error vectors, the primary error generator passes the product (i.e., HE) to a secondary error generator (e.g., secondary error generator 40' in FIG. 3). In an implementation, the product may be passed using a first-in, first-out (FIFO) queue.

Figure 9A:
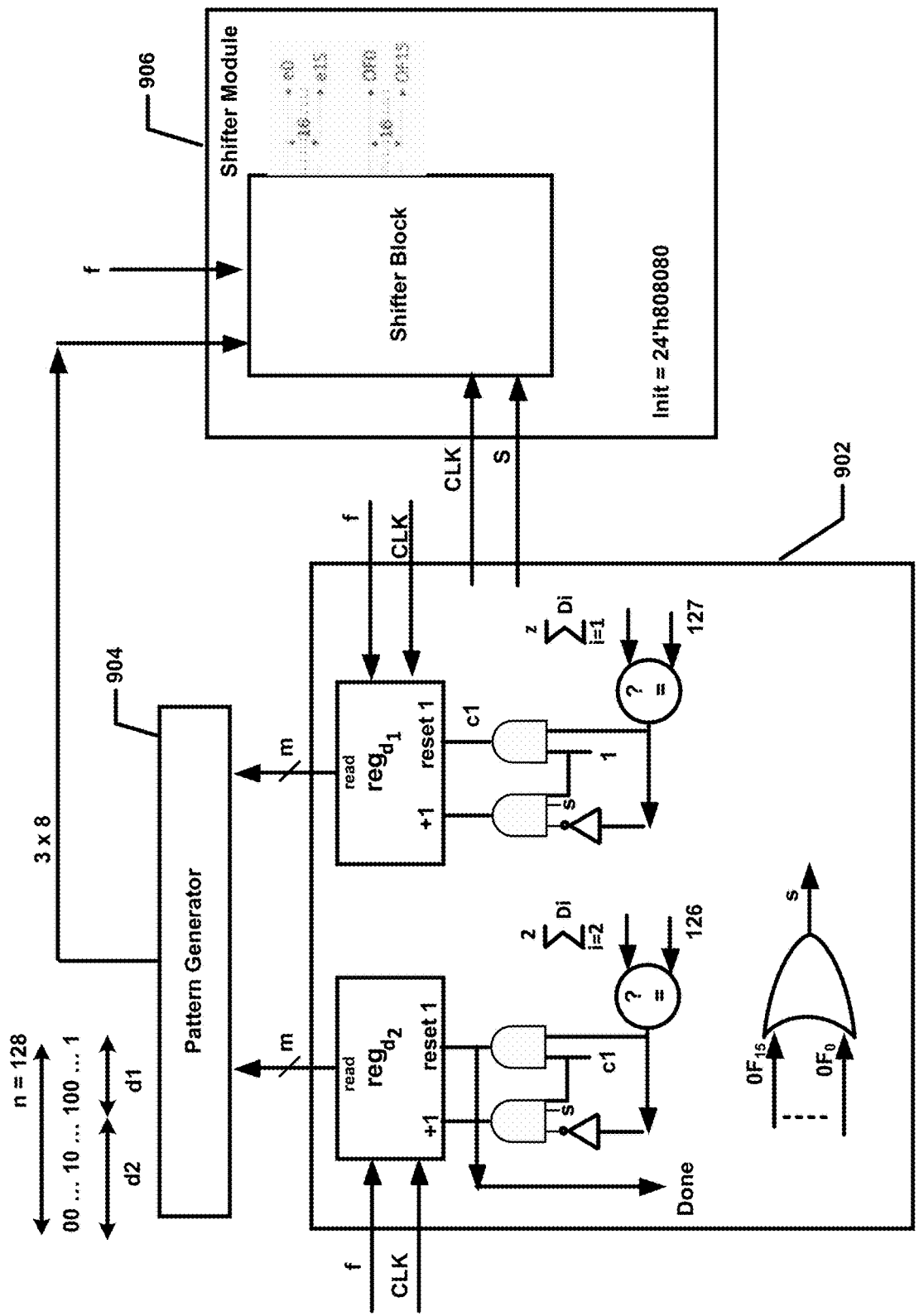
FIG. 9A is a block diagram of an example secondary error generator, in accordance with an embodiment of the present disclosure.

As shown in FIG. 9A, a secondary error generator 900 includes distance logic 902, a pattern generator 904, and a shifter module 906. In embodiments, the structure of secondary error generator 900 is similar to the structure of primary error generator 400 described previously.

Referring to secondary error generator 900, distance logic 902 is configured to update the distance between the 1's in the next generated pattern. That is, distance logic 902 is responsible for generating patterns with different distance between the 1's. In operation, whenever shifter module 906 is done shifting a pattern, an overflow signal, s, is sent to distance logic 902, which indicates that distance logic 902 needs to update the distances between the 1's of the next pattern.

Figures 10A, 10B:
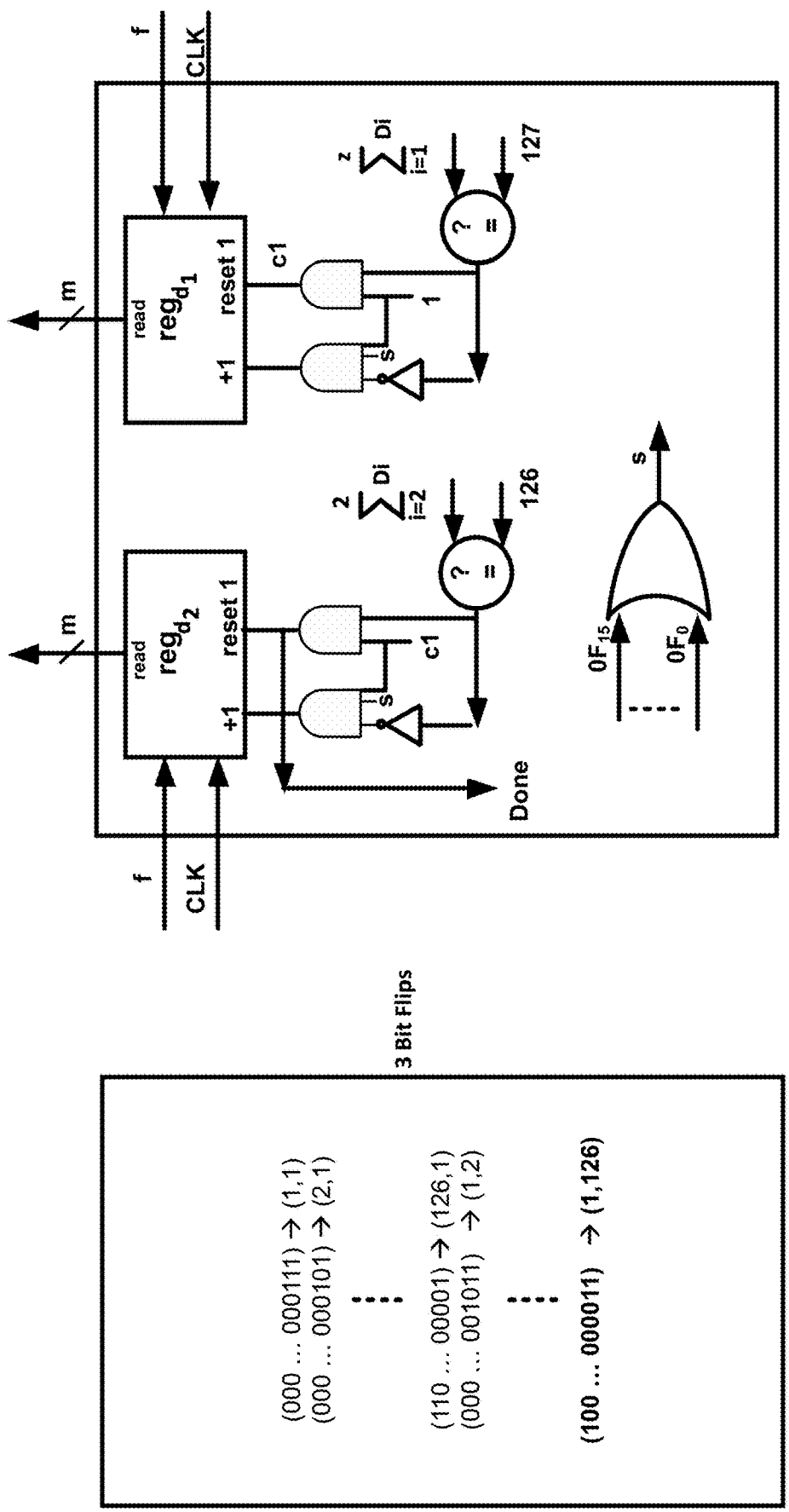
FIG. 10A is an example of error vectors mapping to distance pairs.
FIG. 10B is an example distance logic circuit of the secondary error generator of FIG. 9, in accordance with an embodiment of the present disclosure.

For instance, in an example case of a BSC, as shown in FIG. 10A (with distance logic 10B), an emerging pattern may be observed when the expected error patterns are arranged in order of decreasing probability. As can be seen in FIG. 10A, D1 may refer to the number of bits between a least significant high bit and a second least significant high bit (with the second high bit included). D2 may refer to the number of bits between the most significant high bit and the second least significant high bit (with the second high bit included). The values of the (D1,D2) pair may be given by the following:

$$\{(D1,D2)|D1 \in [0,127] \wedge D2 \in [0,126] \wedge D1=127-D2\} \quad [2]$$

In embodiments, distance logic 902 may take into consideration this pattern of (D1,D2) pairs and sequentially generate these values upon receiving or otherwise being provided the appropriate overflow signal. In an implementation, distance logic 902 may be realized as counters. In such implementations, distance logic 902 can increment the values of D1 and D2 each time an overflow condition is satisfied (i.e., each time distance logic 902 approaches the overflow condition).

Referring again to FIG. 9A, pattern generator 904 is configured to feed or otherwise provide new error patterns to shifter module 906, every time shifter module 906 needs a new error pattern to shift. To this end, pattern generator 904 receives as input the value of the (D1,D2) pair from distance logic 902 and generates the input seed pattern for shifter module 906. In an example implementation, pattern generator 904 may generate the seed pattern using the following expression:

$$X=1+2^{D1}-(D1==0)+2^{D1+D2}-(D2==0)2^{D1} \quad [3]$$

The output of pattern generator 904 is the indices of the active high bits of the error vector. For example, for the error vector $\vec{e}=(0000\ldots010001)$, pattern generator 904 generates 0 and 4 as its output. As another example, for the error vector $\vec{e}=(0000\ldots10101)$, pattern generator 904 generates 0, 2, and 4 as its output.

Figure 11:
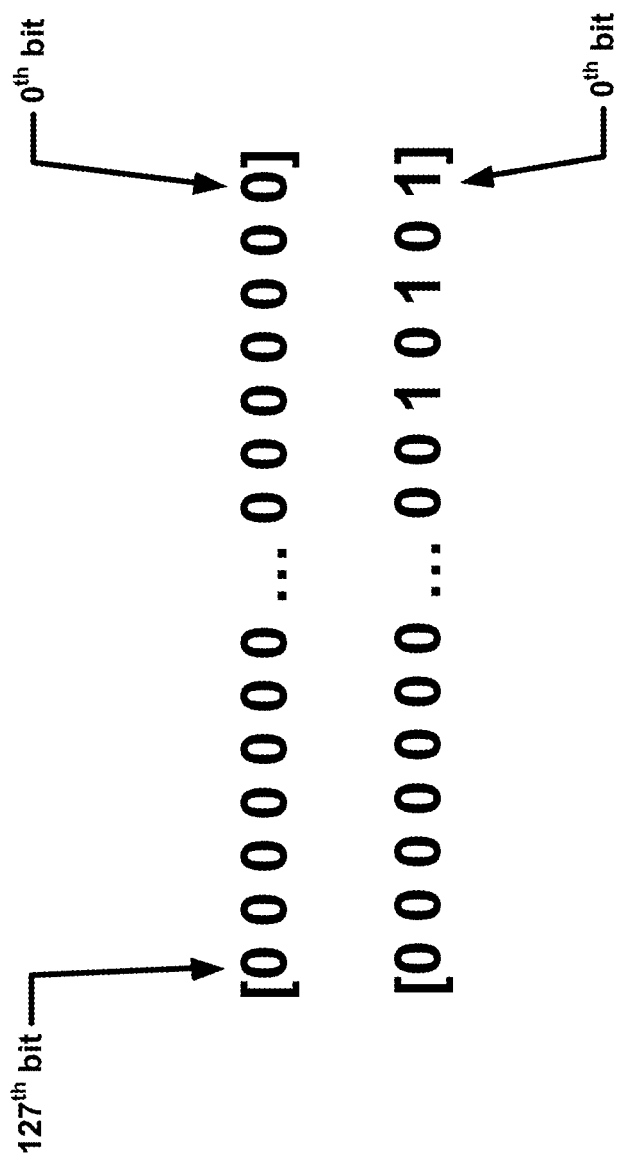
FIG. 11 shows an example of a three bit flip pattern, in accordance with an embodiment of the present disclosure.

For instance, as shown in FIG. 11, pattern generator 904 may generate pointers to the indices which have bit values of 1. As can be seen, the one bit flip pattern and the two bit flip pattern are consistent with the description provided above in conjunction with FIGS. 6 and 7, respectively, above. In this instance, as shown in FIG. 11, on the basis of D1 and D2, pattern generator 904 may generate a three bit flip pattern, 24'h04_02_00. In the generated vector, 00 refers to the high bit at index 0 and corresponds to the first bit flip, 02 refers to the high bit at index 2 and corresponds to the second bit flip and 04 refers to the high bit at index 4 and corresponds to the third bit flip.

Referring again to FIG. 9A, shifter module 906 is configured to receive as input the seed pattern from pattern generator 904 and cyclically shift the pattern towards the most significant bit. This essentially performs a Logical Shift Left (LSL) operation on the vector. In operation, shifter module 906 receives the indices of the active high bits. Thus, to perform an LSL operation, shifter module 906 adds 1 to the existing values of the indices. In embodiments, shifter module 906 may be capable of generating as many as 16 error vectors at the same time, in each clock cycle, which allows for parallelized operation.

Figure 12:
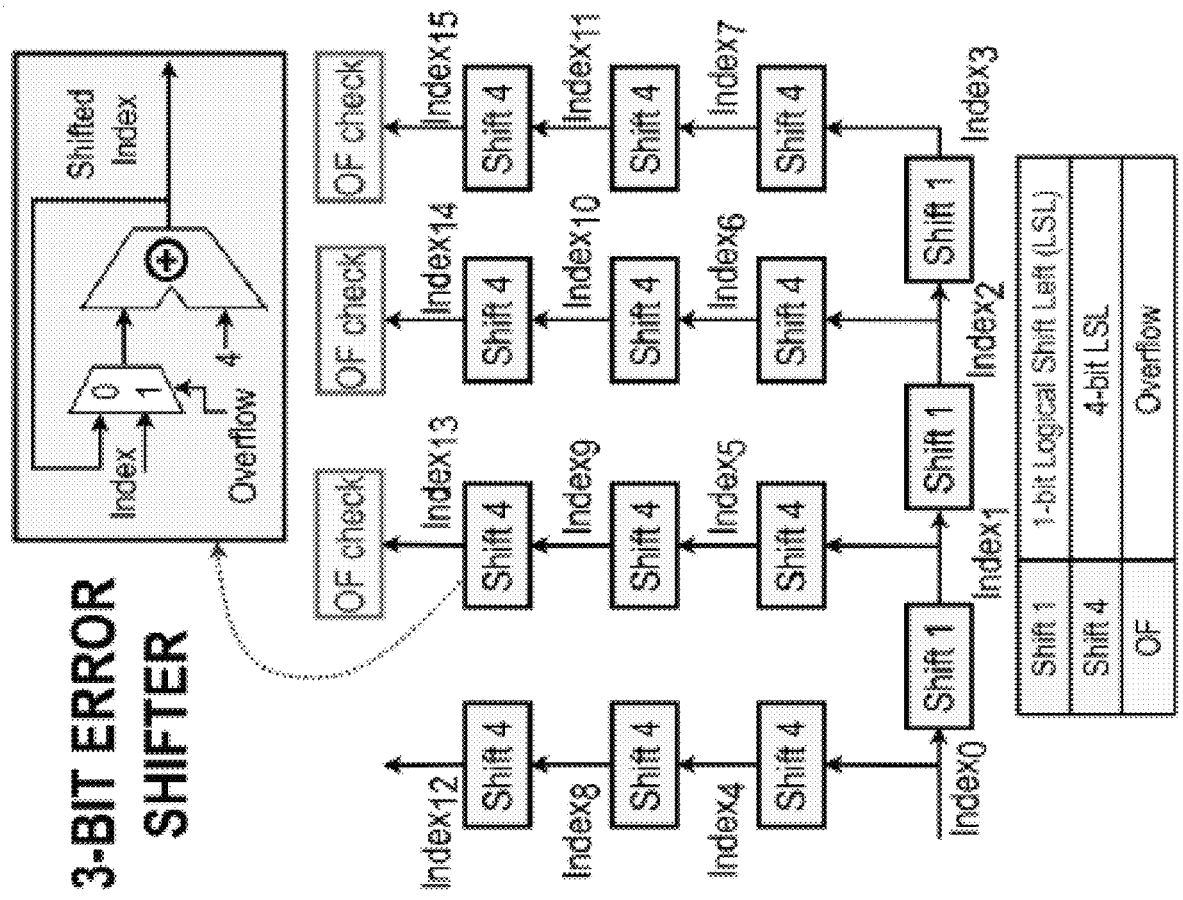
FIG. 12 is a block diagram of an example shifter module, in accordance with an embodiment of the present disclosure.

In an example implementation, as shown in FIG. 12, shifter module 906 may be configured to generate the error vectors in four branches in parallel. As can be seen in FIG. 12, shifter$_t$ blocks shifts a vector t times and the output is written to the corresponding register reg$_{e_i}$. OF$_i$ is a signal that is 1 whenever a shift results in an overflow. A basic pattern, denoted by e0, is shifted 16 times, which outputs 16 shifts of the basic pattern each clock cycle. This is a crucial part of the parallelization of the chip, as it provides 16 error vectors within a single cycle. Note that shifting a binary string by t bits is equivalent to multiplying the represented integer by $2^t$.

Similar to shifter module 406 described previously, shifter module 906 is also configured to generate the overflow signals. Again, an overflow may be defined as the condition in which the MSB of the error vector goes high. This condition is chosen since a further LSL operation on the vector will reduce the number of high bits in the vector, thereby changing its weight (e.g., Hamming weight). If a shifting operation results in overflow (of one of the ones (1's) of the input), or if the output of a shifter unit is the 0 string, the corresponding OF$_i$ signal is set to one (otherwise it is set to zero). Shifter module 906 may collectively send the overflow signals to distance logic 902, where a bitwise OR operation is performed on all the overflow values. The result is used to increment the counters for the (D1,D2) pair, to generate the next seed pattern. That is, the OF$_i$ signals inform distance logic 902 when it needs to update the distances for the next error pattern.

Error Generator

Figure 9B:
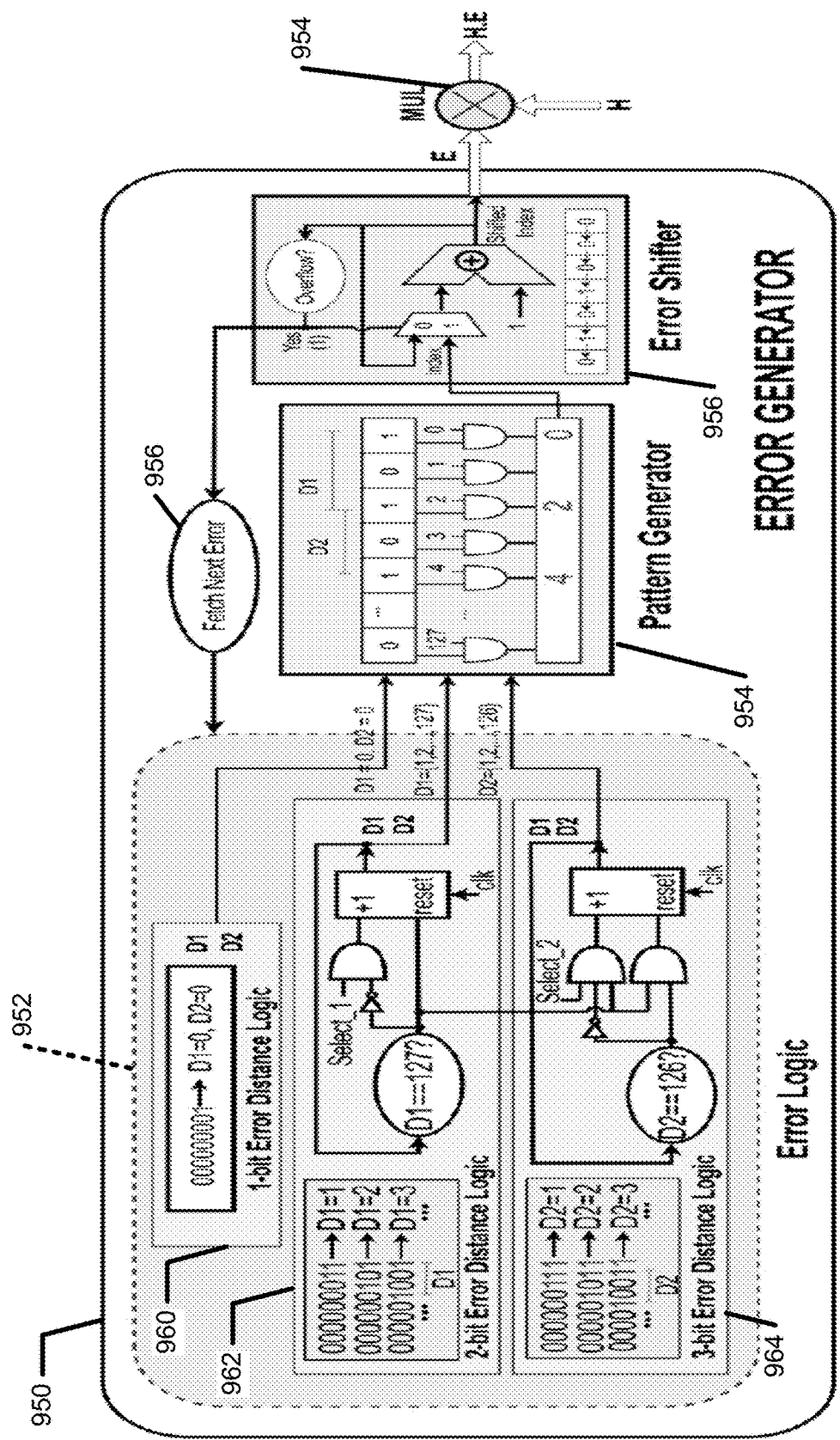
FIG. 9B is a block diagram of an example error generator, in accordance with an embodiment of the present disclosure.

Referring now to FIG. 9B, an error generator 950 comprises an error logic circuit 952 (or more simply error logic) coupled to a pattern generator 954 and error shifter 956. As illustrated in FIG. 9A, error generator 950 generates, creates or otherwise provides ordered error sequences in parallel.

Error logic 952 comprises 1-bit distance logic 960, 2-bit distance logic 962 and 3-bit distance logic 964, and generates (D1,D2) distance pairs to indicate the distances between the active high bits (1s) in a guessed noise sequence (E).

Pattern generator 954 constructs the bit sequence defined by (D1,D2), which is then used as the indices of the input-seed 1s for error shifter 956. Error shifter 956 creates in parallel two (2) and sixteen (16) variations of the seed sequence through cyclical shifts for the primary and secondary EGs. For the 3-bit Error Shifter, the error vectors are generated in parallel branches (here, in four (4) parallel branches) to reduce critical path delay via a combination of 1-bit and 4-bit logical shift left.

Figure 13A:
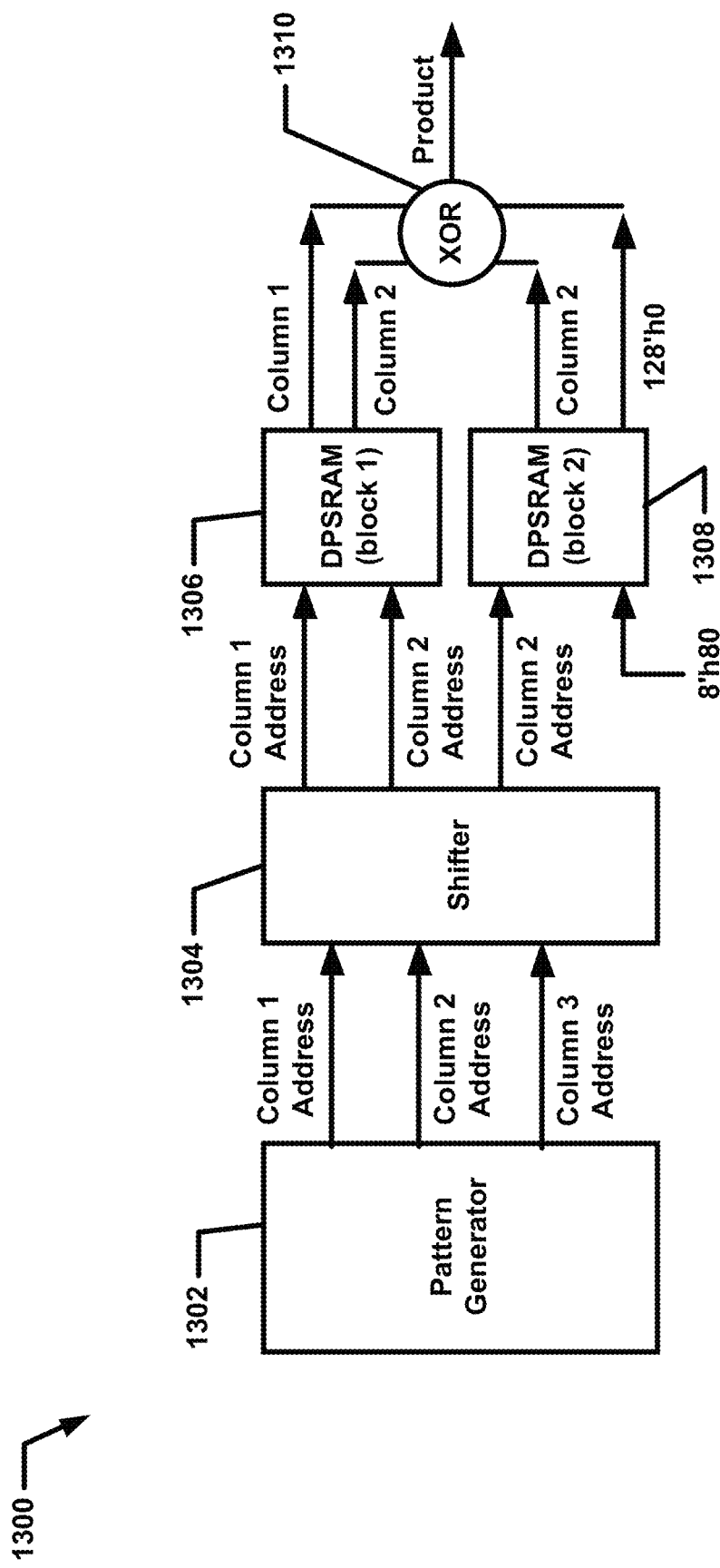
FIG. 13A is a block diagram of an example multiplication module of a secondary error generator, in accordance with an embodiment of the present disclosure.

FIG. 13A illustrates an example multiplication module 1300 of secondary error generator 900, in accordance with an embodiment of the present disclosure. In particular, multiplication module 900 is implemented using two dual port SRAMs. Each dual port SRAM allows for accessing two memory locations at once through its two access ports. The two dual port SRAMs enable primary error generator 900 to obtain three columns of the parity matrix H each cycle.

In an embodiment, as shown in FIG. 13A, instead of generating binary values from a pattern generator (see reference numeral 1302 in FIG. 13A), the pattern generator generates three decimal values which signify the positions of '1' in the error vector. The outputs from the pattern generator (i.e., the column addresses) are provided as inputs to a shifter (see reference numeral 1304 in FIG. 13A), which is incremented by one in each step. Two of the outputs from the shifter are provided as inputs to a first DPSRAM (see reference numeral 1306 in FIG. 13A), where the respective column is obtained. The third output from the shifter is provided as an input to a second DPSRAM (see reference numeral 1308 in FIG. 13A), where the corresponding column is obtained. The outputs from the first and second DPSRAMs are then compared, possibly by being XORed, (see reference numeral 1310 in FIG. 13A) and a final product is obtained. Note that two DPSRAMS are utilized since secondary error generator 900 generates the error with three bit flips and, thus, requires three access lines. This renders one of the ports of the second DPSRAM (e.g., DPSRAM 1308) not being utilized. During multiplication, the port of the second DPSRAM that is not utilized may be turned to an OFF state via means of a port enable signal, for example.

Figure 13B:
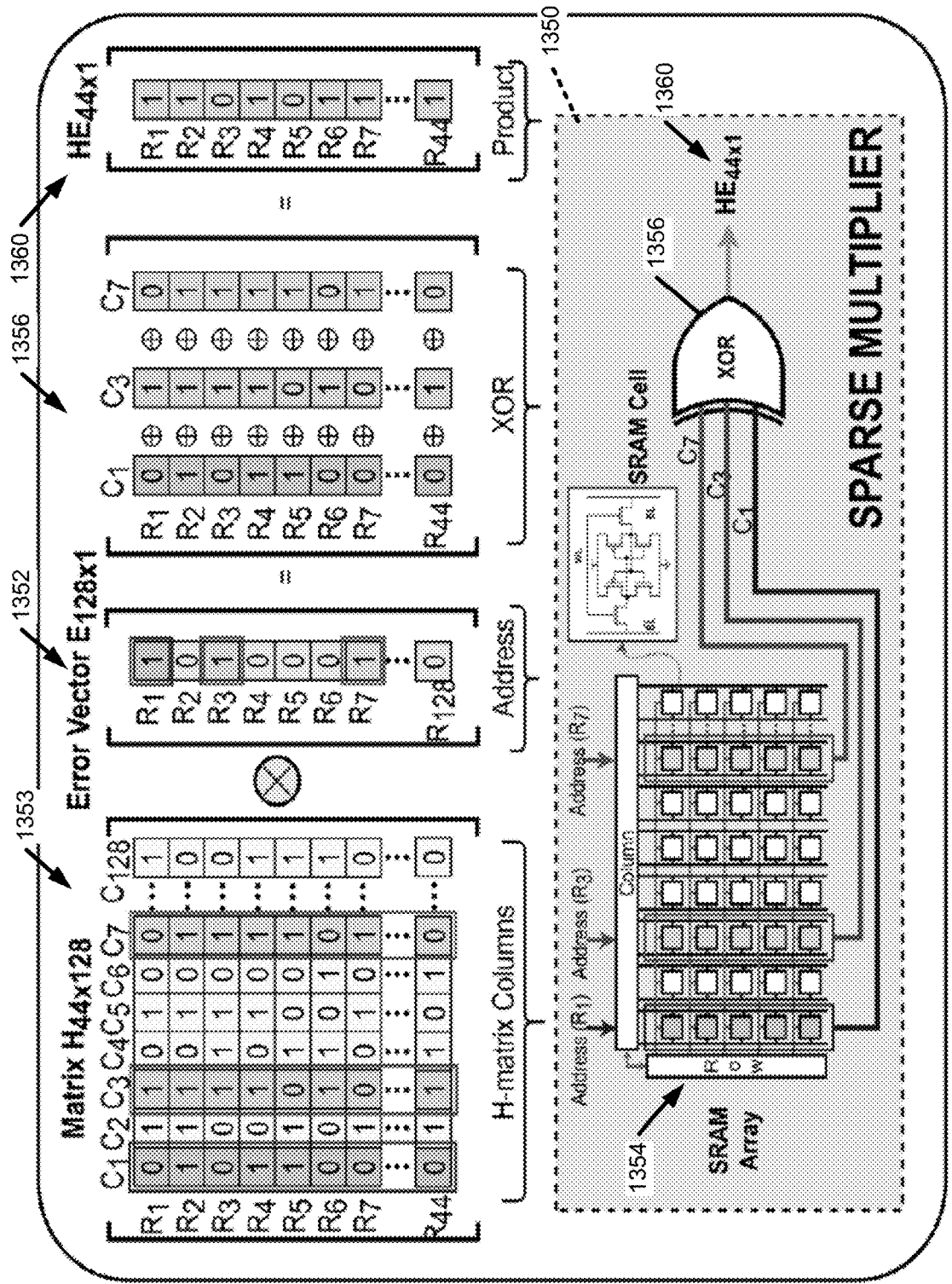
FIG. 13B is a block diagram of an example sparse multiplier, in accordance with an embodiment of the present disclosure.

Sparse Multiplier:

Referring now to FIG. 13B, shown is an illustrative sparse multiplier 1350. Error vectors 1352 are fed into a matrix-vector multiplication unit to calculate and check if H·Y, equals H·E, where H is a parity matrix 1353. In this example embodiment, parity matrix H 1353 has forty-four (44) rows and one hundred twenty eight (128) columns ($H_{44 \times 128}$) and error vector E has 128 rows and 1 column ($E_{128 \times 1}$). In other embodiments, other matrix sizes selected to suit the needs of a particular application may be used. In general, the error vector E will have few non-zero entries. For example, in embodiments error vector E may a maximum of 3 non-zero entries for a 128×1 error vector. In the example of FIG. 13A, rows R1, R3 and R7 are the only non-zero entries in error vector E. It is noted that the parity matrix values and error vector values may be stored in a memory prior to being loaded (or stored) in memory 1354.

To achieve low-latency multiplication in a single clock cycle, it is possible to leverage the sparsity of the error matrix (or error vector) E. Sparse matrix E active high bits (i.e. R1, R3, R7, in this example) are used as the column address for H matrix stored in a memory 1354 (here illustrated as dual-port SRAMs). The data in the selected columns C1, C3, C7 of memory 1354 is provided to logic circuit 1356 which performs a logical XOR operation (i.e. columns C1, C3, C7 are XORed via logic circuit 1356) to produce a product H·E 1360 ($HE_{44 \times 1}$).

Figure 14A:
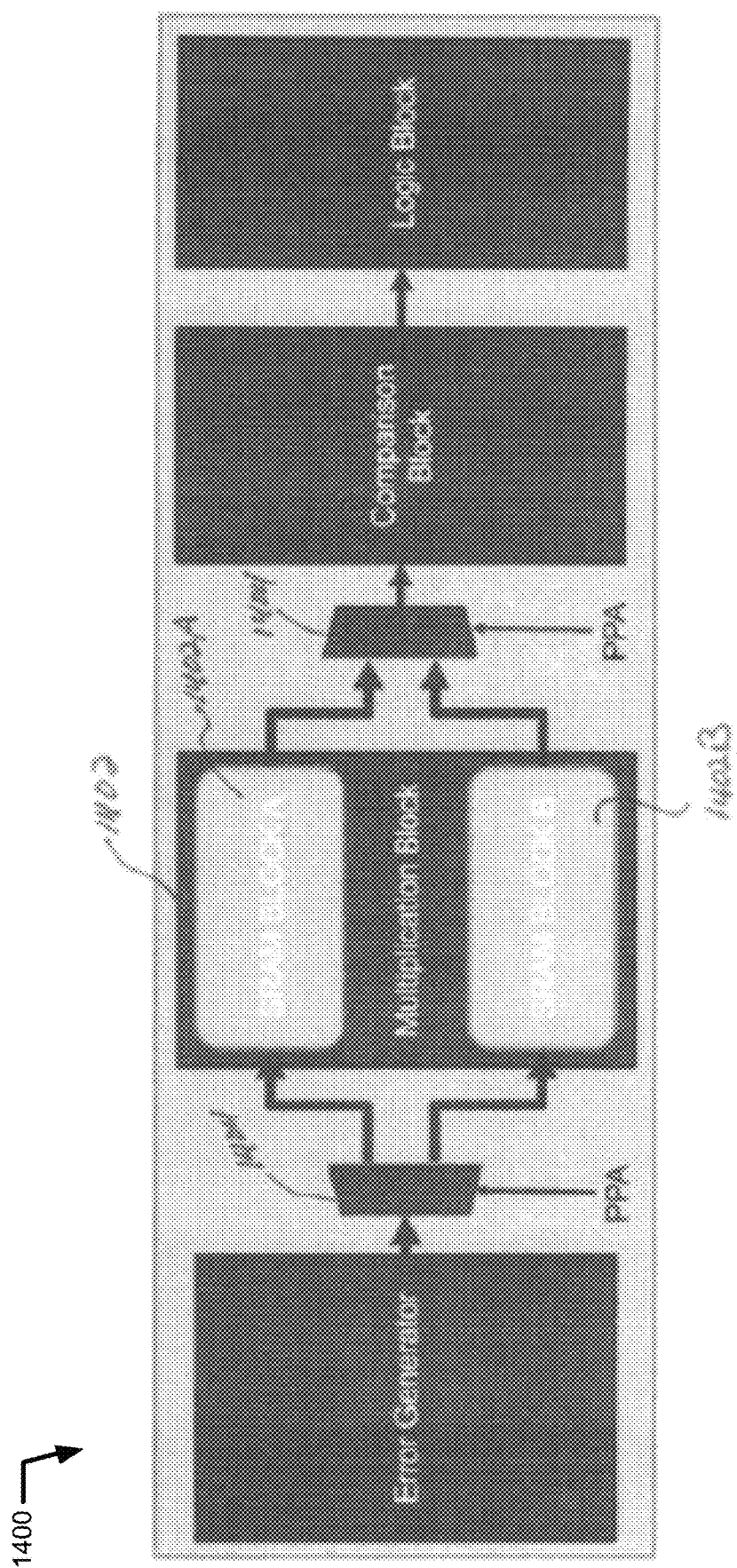
FIG. 14A is a block diagram of an example architecture for rerandomizing codebooks, in accordance with an embodiment of the present disclosure.

FIG. 14A illustrates an example architecture 1400 for rerandomizing codebooks, in accordance with an embodiment of the present disclosure. Architecture 1400 provides a physical layer of security in the communication and decoding methodology. This is achieved by rerandomizing the codebook in a time interleaved architecture. For example, suppose two generator matrices $G_0$ and $G_1$ with the corresponding parity matrices $H_0$ and $H_1$. The codewords that are encoded with $G_0$ can only be decoded with $H_0$. Similarly, the codewords that are encoded with $G_1$ can only be decoded with $H_1$. Based on this principle, as shown in FIG. 14, a multiplication block (see reference numeral 1402 in FIG. 14) includes an SRAM block A (see reference numeral 1402A in FIG. 14) and an SRAM block B (see reference numeral 1402B in FIG. 14). Each SRAM block contains a parity matrix H of another code. For example, SRAM block A can contain $H_0$ and SRAM block B can contain $H_1$. A code selector block (see reference numeral 1404 in FIG. 14) can be used to determine which parity matrix H (i.e., SRAM block A or SRAM block B) a codeword is input into, and the corresponding H matrix is used to decode the codeword. This allows for decoding multiple codes.

In embodiments, additional control (not shown) may allow for changing the parity matrix in one of the SRAM blocks while the other SRAM block is being utilized for decoding an incoming channel output. This allows for effectively reducing (and ideally eliminating) any downtime that may be caused by changing the parity matrix. In embodiments, a random number generator may be used to generate a string of values to determine a sequence of the parity matrices to be used. In some such embodiments, the sequence of parity matrices may be generated at the start of the chip operation. In an embodiment, the sequence of parity matrices may be stored off chip, for example, in a secure storage.

Figure 14B:
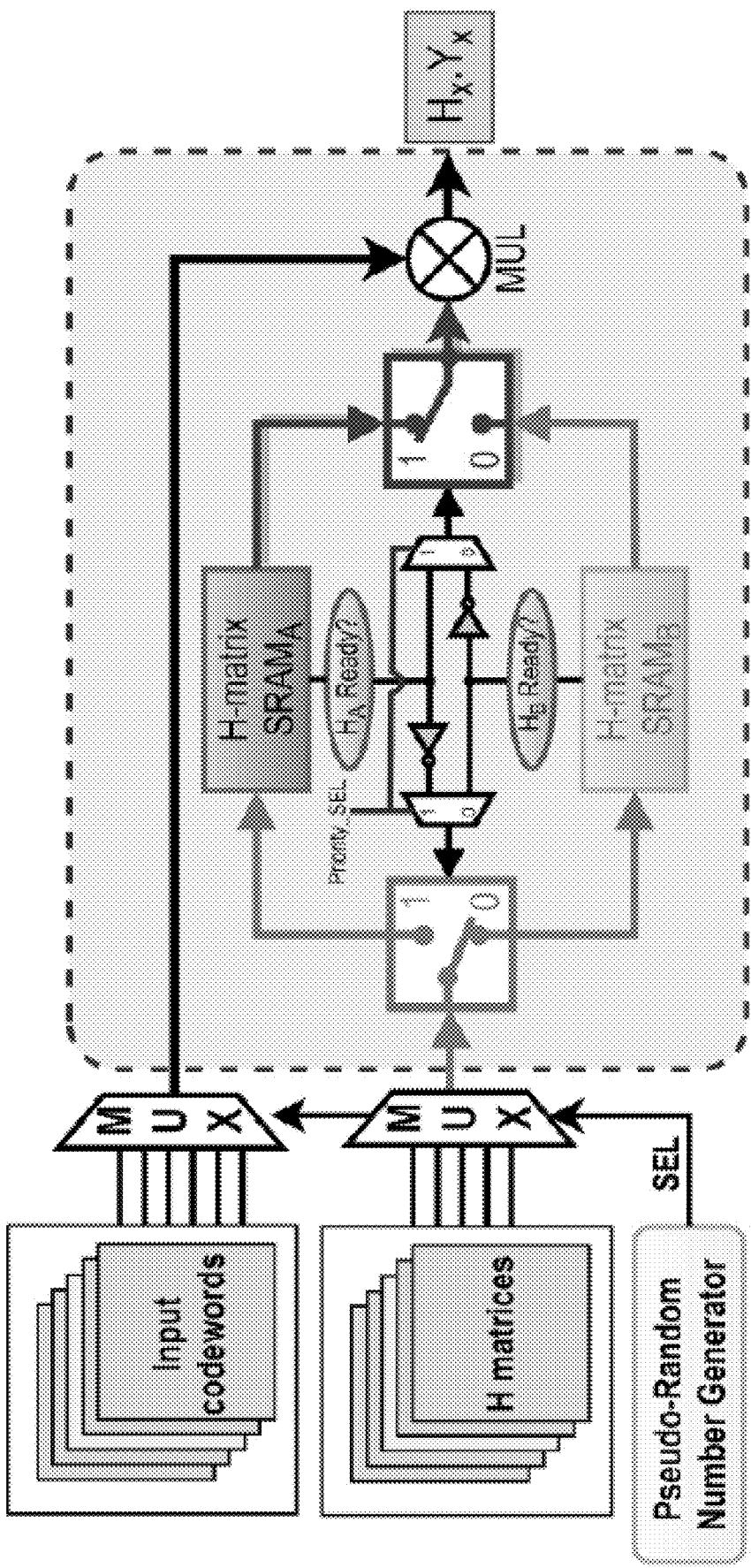
FIG. 14B is a block diagram of an example architecture for code interleaving and rerandomizing codebooks, in accordance with an embodiment of the present disclosure.
Figure 14C:
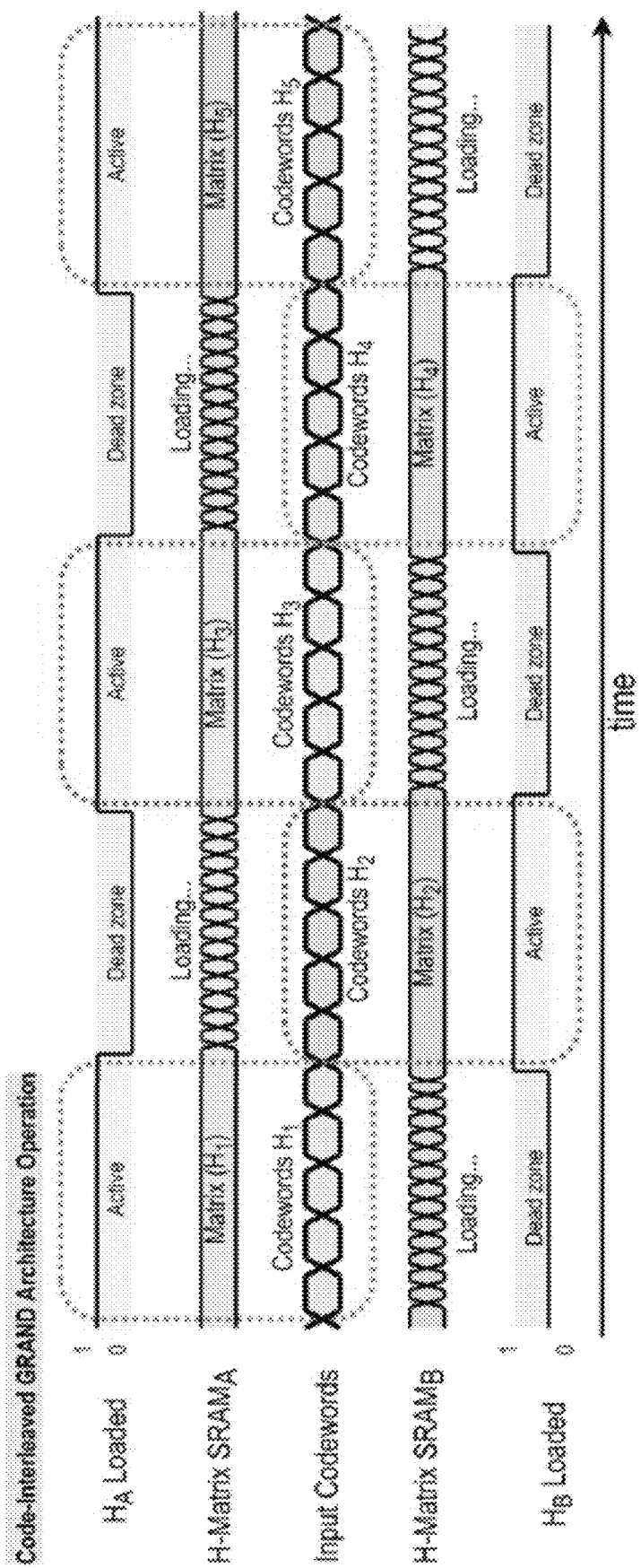
FIG. 14C is a diagram illustrating code interleaving, in accordance with an embodiment of the present disclosure.

Code-Interleaving:

FIGS. 14B, 14C illustrate code interleaving (CI) performed by a decoder such as the universal decoder describe above in conjunction with FIGS. 1-3, for example).

Referring to FIG. 14B, input codewords and H matrix values are multiplexed between parallel signal paths each leading to memories (here a pair of SRAMS) in which H matrix values are stored. A pseudo-random number generator is coupled to the multiplexors (muxes) and causes the respective muxes to randomly select one of a plurality of input codewords and one of a plurality of H matrices. The input codeword mux forwards or otherwise direct the selected input (and thus the data on the selected input) to an input of a, multiplier circuit. The H matrix mux forwards or otherwise direct the selected input (and thus the data on the selected input) to an input of an H-matrix memory selector switch (here illustrated as a single pole double throw switch). The switch outputs are selectively coupled between a pair of memories. Thus, data from the H matrix mux are selectively provided (in an interleaved manner) to one of the pair of H-matrix memories. In operation when H matrix data is being loaded into one of the H-matrix memories, the other H-matrix memory may be used for decoding codewords. That is, when data is being loaded into one memory, the other memory is active.

The code interleaving in FIG. 14B efficiently re-randomizes the code-books in real time by simultaneously decoding and changing H matrices stored in SRAMs to avoid dead zone. Thus, when a matrix in one SRAM is ready to be used for a decoding operation, the matrix in the other SRAM is being changed. This interleaving approach increases the throughput of dynamic code-book initialization. In embodiments, the throughput of dynamic code-book initialization is increased by 1.6×.

When an incorrect H matrix is used for RLC decoding, latency may be degraded. This feature can be exploited as a security layer by dynamically randomizing the code-book.

Referring to FIG. 14C, shown are the active, dead zone and loading times of the two memories during operation.

Tag-Based Reordering

Figure 15A:
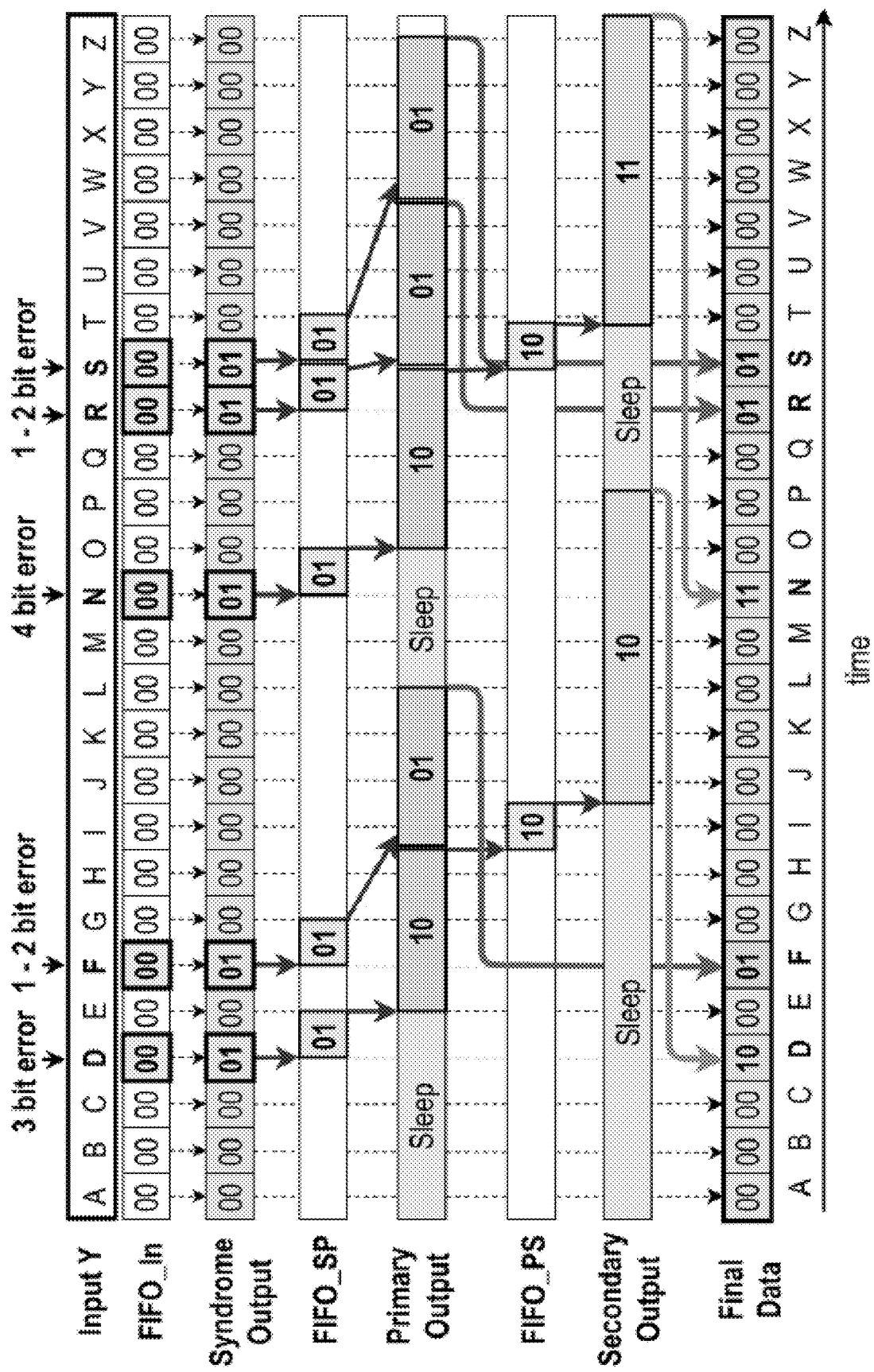
FIG. 15A is a diagram illustrating an example use of 2-bits flags for re-ordering the outputs of a syndrome calculator, in accordance with an embodiment of the present disclosure.

Referring to FIG. 15A, shown is an example of tag based re-ordering as may be used in the system of FIG. 3B, for example. As noted in conjunction with FIG. 3B, different processing times of the syndrome, primary and secondary EGs result in out-of-order decoded codewords. Such out-of-order decoded codewords may be re-ordered using a tag for successful information recovery. In the example embodiment of FIG. 15A a two-bit tag is used for successful information recovery. Tags for reordering outputs of a 3-stage pipeline are shown in FIG. 15B.

As shown in FIG. 15A, for the syndrome calculator output (e.g. as shown in FIG. 3A), the tag bit 00 means that HY is zero and 01 means that HY is non-zero. If HY is non-zero, the codeword will be passed to a primary error generator (e.g. primary error generators 40a, 112 in FIGS. 3A, 3B, respectively) for checking against rank-ordered noise sequences with one and two-bit flips in decreasing probability. If the correct error sequence is found in the primary error generator, the tag bit will remain as 01 and the primary out will be the final output. Otherwise, the tag bit will be changed to 10. Then the codeword will be processed in a secondary error generator (e.g. secondary error generator 40b in FIG. 3A) by checking the possible error sequences with three-bit flips ordered by likelihood. If the correct noise pattern is found in the secondary error generator, then the tag bit will stay as 10. In this case, the decoder will output the codeword from the secondary out. Otherwise, the tag bit will be changed to 11 and this tag value indicates a failure in decoding.

FIG. 15A illustrates an example use of 2-bits flags for order combining the outputs of a syndrome calculator, in accordance with an embodiment of the present disclosure. Example syndrome calculators are illustrated in FIGS. 3A, 3B (e.g., syndromes 32, 104, respectively). The following provides an example pseudo code for a tag based re-ordering system:

```
For each Syndrome output
    If its flag is 01
        Wait for a primary error generator output
        If its flag is 10
            Wait for a secondary error generator output
            Replace both codeword and flag
        End
        Replace both codeword and flag
    End
    Replace both codeword and flag
End
```

FURTHER ILLUSTRATIVE EMBODIMENTS

The following examples pertain to further embodiments, from which numerous permutations and configurations will be apparent.

Example 1 includes a method including: demodulating, by a decoder, a carrier signal to generate a received signal; computing, by the decoder, a syndrome of the received signal; generating, by the decoder, a first error vector; checking, by the decoder, whether the syndrome of the received signal is equal to the syndrome of the first error vector; and responsive to the two syndromes being equal, identifying the first error vector as being the actual error vector; and generating an information word based on inverting the effect of the actual error vector from the received signal.

Example 2 includes the subject matter of Example 1, wherein the first error vector is generated based on at least one characteristic of a communication channel via which the carrier signal is received.

Example 3 includes the subject matter of Example 2, wherein the at least one characteristic includes an expected uncoded bit error rate (BER).

Example 4 includes the subject matter of Example 2, wherein the at least one characteristic includes a model of noise in the channel.

Example 5 includes the subject matter of any of Examples 1 through 4, wherein when the syndrome of the first error vector and the syndrome of the received signal are not equal, one or more error vectors are generated by the decoder the following steps are performed: checking, by the decoder, whether the syndrome of the received signal is equal to the syndrome of one of the one or more error vectors; responsive to the two syndrome of the received signal's syndrome being equal to the syndrome of at least one of the error vectors, identifying an error whose syndrome is equal to the syndrome of the received signal vector as being the actual error vector; and generating an information word based on inverting the effect of the actual error vector from the received signal.

Example 6 includes the subject matter of Example 5, wherein the second error vector is an error vector with Hamming weight of one and subsequent errors vectors are in increasing Hamming weight order.

Example 7 includes the subject matter of Example 6, wherein the first error vector and the second error vectors are error vectors of a plurality of error vectors, the plurality of error vectors arranged in decreasing order of probability.

Example 8 includes the subject matter of any of Examples 1 through 7, wherein syndromes for the received signal and the first error vector are computed for more than one codebook.

Example 9 includes a method including: generating a syndrome of a channel output Y; responsive to a determination that the syndrome is a zero vector, identifying the syndrome as a resultant codeword and generating an information word based on the resultant codeword; and responsive to a determination that the syndrome is not a zero vector, generating a first error vector; and responsive to a determination that a product of the first error vector with a parity matrix H is equal to the syndrome, inverting the effect of the first error vector from the channel output Y to obtain an expected codeword; identifying the expected codeword as a resultant codeword; and generating an information word based on the resultant codeword.

Example 10 includes the subject matter of Example 9, wherein the information word can be used to perform inverse polar transformation off chip.

Example 11 includes the subject matter of any of Examples 9 and 10, wherein the first error vector is one of a plurality of error vectors, the plurality of error vectors arranged in decreasing order of probability.

Example 12 includes the subject matter of any of Examples 9 through 11, wherein the first error vector is generated based on at least one characteristic of the channel.

Example 13 includes the subject matter of any of Examples 9 through 12, wherein the at least one characteristic includes an expected uncoded bit error rate (BER) or a model of noise in the channel.

Example 14 includes the subject matter of any of Examples 9 through 13, further including, responsive to a determination that a product of the first error vector with a parity matrix H is not equal to the syndrome, generating a second error vector; and responsive to a determination that a product of the second error vector with the parity matrix H is equal to the syndrome, subtracting the second error vector from the channel output Y to obtain an expected codeword; identifying the expected codeword as a resultant codeword; and generating an information word based on the resultant codeword.

Example 15 includes the subject matter of Example 14, wherein more than one parity matrix H is used to compute the syndromes of the received signal and the first error vector.

Example 16 includes the subject matter of any of Examples 9 through 15, wherein the second error vector is one of a plurality of error vectors, the plurality of error vectors arranged in decreasing order of probability.

Example 17 includes the subject matter of any of Examples 9 through 16, wherein syndromes for the received signal and the error vectors are computed for more than one codebook.

Example 18 includes the subject matter of any of Examples 9 through 17, wherein error generators operate at different speeds according to the types of errors they generate.

Example 19 includes the subject matter of Example 18, wherein error generators for errors with higher Hamming weight operate at higher frequencies.

Example 20 includes an error generator wherein errors are generated by use of shifters.

Example 21 includes the subject matter of Example 20, wherein error patterns are controlled by distance logic determining the type of shifts.

Example 22 includes the subject matter of Example 21, wherein some of the shifts are associated with an order of the probability of the generated error vectors.

Example 23 includes the subject matter of any of Examples 20 through 22, wherein error generators operate at different speeds according to the types of errors they generate.

Example 24 includes the subject matter of Example 23, wherein error generators for errors with higher Hamming weight operate at higher frequencies.

Example 25 includes a method including: labeling of received signals at an encoder; and ordering of the information words corresponding to the received signals according to the labeling.

Disclosed embodiments may be implemented in any of a variety of different forms. For example, disclosed embodiments can be implemented within various forms of communication devices, both wired and wireless, such as television sets, set top boxes, audio/video devices, smartphones, laptop computers, desktop computers, tablet computers, satellite communicators, cameras having communication capability, network interface cards (NICs) and other network interface structures, base stations, access points, and modems.

The subject matter described herein can be implemented in digital electronic circuitry, or in computer software, firmware, or hardware, including the structural means disclosed in this specification and structural equivalents thereof, or in combinations of them. The subject matter described herein can be implemented as one or more computer program products, such as one or more computer programs tangibly embodied in an information carrier (e.g., in a machine-readable storage device), or embodied in a propagated signal, for execution by, or to control the operation of, data processing apparatus (e.g., a programmable processor, a computer, or multiple computers). A computer program (also known as a program, software, software application, or code) can be written in any form of programming language, including compiled or interpreted languages, and it can be deployed in any form, including as a stand-alone program or as a module, component, subroutine, or another unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub programs, or portions of code). A computer program can be deployed to be executed on one computer or on multiple computers at one site or distributed across multiple sites and interconnected by a communication network.

The processes and logic flows described in this specification, including the method steps of the subject matter described herein, can be performed by one or more programmable processors executing one or more computer programs to perform functions of the subject matter described herein by operating on input data and generating output. The processes and logic flows can also be performed by, and apparatus of the subject matter described herein can be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processor of any kind of digital computer. Generally, a processor will receive instructions and data from a read-only memory or a random access memory or both. The essential elements of a computer are a processor for executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. Information carriers suitable for embodying computer program instructions and data include all forms of nonvolatile memory, including by ways of example semiconductor memory devices, such as EPROM, EEPROM, flash memory device, or magnetic disks. The processor and the memory can be supplemented by, or incorporated in, special purpose logic circuitry.

In the foregoing detailed description, various features are grouped together in one or more individual embodiments for the purpose of streamlining the disclosure. This method of disclosure is not to be interpreted as reflecting an intention that each claim requires more features than are expressly recited therein. Rather, inventive aspects may lie in less than all features of each disclosed embodiment.

Terms used in the present disclosure and in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

The disclosed subject matter is not limited in its application to the details of construction and to the arrangements of the components set forth in the following description or illustrated in the drawings. The disclosed subject matter is capable of other embodiments and of being practiced and carried out in various ways. As such, those skilled in the art will appreciate that the conception, upon which this disclosure is based, may readily be utilized as a basis for the designing of other structures, methods, and systems for carrying out the several purposes of the disclosed subject matter. Therefore, the claims should be regarded as including such equivalent constructions insofar as they do not depart from the spirit and scope of the disclosed subject matter.

Also, the phraseology and terminology used in this patent are for the purpose of description and should not be regarded as limiting. As such, the conception upon which this disclosure is based may readily be utilized as a basis for the designing of other structures, methods, and systems for carrying out the several purposes of the disclosed subject matter. Therefore, the claims should be regarded as including such equivalent constructions insofar as they do not depart from the spirit and scope of the disclosed subject matter.

Although the disclosed subject matter has been described and illustrated in the foregoing illustrative embodiments, it is understood that the present disclosure has been made only by way of example, and that numerous changes in the details of implementation of the disclosed subject matter may be made without departing from the scope of the disclosed subject matter. Accordingly, the scope of this patent should not be limited to the described implementations but rather should be limited only by the spirit and scope of the following claims.

What is claimed is:

1. A universal decoder comprising:
   a syndrome calculator for checking membership of received data in a codebook; and
   an error generator, coupled to the syndrome calculator, the error generator including a primary error generator and a secondary error generator coupled to the primary error generator, wherein in response to the syndrome calculator detecting an error, the syndrome calculator provides the error to the error generator and the error generator calculates rank-ordered binary symmetric channel noise patterns and checks for membership in the codebook, wherein data is pipelined such that processing of data in the syndrome calculator, primary error generator and secondary error generator result in out-of-order decoded codewords;
   a re-ordering circuit configured to receive the out-of-order decoded codewords and configured to re-order the out-of-order decoded codewords; and
   wherein the universal decoder utilizes noise statistics to optimize an energy per decoded bit by dynamic clock gating of the primary and secondary error generators based on a probability of error likelihood.

2. The universal decoder of claim 1 wherein the primary and secondary error generators are configured to check errors in parallel to reduce latency in processing codewords.

3. A universal decoder comprising:
   a syndrome calculator for checking membership of received data in a codebook, and an error generator, coupled to the syndrome calculator, wherein in response to the syndrome calculator detecting an error, the syndrome calculator provides the error to the error generator and the error generator calculates rank-ordered binary symmetric channel noise patterns and checks for membership in the codebook, wherein the error generator comprises:
   an error logic which generates (D1, D2) distance pairs to indicate distances between active bits having a first logic value in a guessed noise sequence (E);
   a pattern generator coupled to the error logic; and
   an error shifter coupled to the error logic and the pattern generator wherein the error logic which generates (D1, D2) distance pairs to indicate the distances between active bits having the first logic value in a guessed noise sequence (E) and the pattern generator constructs a bit sequence defined by (D1, D2), which is then used as indices of one or more input-seed values having the first logic value for the error shifter and the error shifter creates in parallel variations of a sequence of input-seed values through cyclical shifts for the primary and secondary error generators such that the error generator creates ordered error sequences in parallel.

4. The universal decoder of claim 1 wherein the re-ordering circuit comprises a tag-based re-ordering circuit.

5. A universal decoder comprising:
   means for receiving input codewords and H matrix values;
   means for multiplexing H matrix values between parallel signal paths each leading to a pair of memories in which H matrix values are stored;
   a syndrome calculator configured to receive input codewords and H matrix values;
   an error generator, coupled to the syndrome calculator, wherein in response to the syndrome calculator detecting an error, the syndrome calculator provides the error to the error generator and the error generator calculates rank-ordered binary symmetric channel noise patterns and checks for membership in a codebook, wherein data is pipelined such that processing of data in the syndrome calculator and error generator result in out-of-order decoded codewords;
   a re-ordering circuit configured to receive the out-of-order decoded codewords and configured to re-order the out-of-order decoded codewords; and
   wherein the universal decoder utilizes noise statistics to optimize an energy per decoded bit by dynamic clock gating of the error generator based on a probability of error likelihood.

6. The universal decoder of claim 5 further comprising a pseudo-random number generator coupled to the means for multiplexing H matrix values and causing the means for multiplexing H matrix values to randomly select one of a plurality of H matrices.

7. The universal decoder of claim 5 further comprising a pseudo-random number generator coupled to the means for multiplexing H matrix values and causing the means for multiplexing H matrix values to randomly select one of a plurality of input codewords and one of a plurality of H matrices.

8. The universal decoder of claim 5 wherein the means for receiving input codewords and H matrix values directs a selected input codeword to a first input of a multiplier circuit.

9. The universal decoder of claim 8 further comprising means for providing H matrix values from a first one of the pair of memories to a second input of a multiplier circuit such that the multiplier circuit produces a product of the H matrix values and input codewords.

10. The universal decoder of claim 9 further comprising means for loading H-matrix values into a second one of the pair of memories concurrently with the first one of the pair of memories providing H-matrix values to the second input of the multiplier circuit.

11. The universal decoder of claim 9 further comprising means for loading H-matrix data in the pair of memories in an interleaved manner.

12. A universal decoder comprising:
- means for receiving input codewords and H matrix values;
- means for multiplexing H matrix values between parallel signal paths each leading to a pair of memories in which H matrix values are stored;
- a syndrome calculator configured to receive input codewords and H matrix values;
- an error generator, coupled to the syndrome calculator, wherein in response to the syndrome calculator detecting an error, the syndrome calculator provides the error to the error generator and the error generator calculates rank-ordered binary symmetric channel noise patterns and checks for membership in a codebook; and
- means for re-randomizing codebooks in real time by concurrently decoding and changing H matrices stored in the pair of memories such that when an H-matrix in a first one of the pair of memories is ready to be used for a decoding operation, the H-matrix in a second one of the pair of memories is being changed.

13. The universal decoder of claim 5 wherein at least one of the syndrome calculator and the error generator comprise a sparse multiplier configured to receive H-matrix values (H) and error vector values (E) and produce a product value HE.

14. The universal decoder of claim 13 wherein the sparse multiplier comprises a memory having H-matrix values stored therein and wherein active bits of the error vector (E) having the first logic value are used to select column addresses for an H matrix and the selected H matrix columns are logically XORed to produce the product value HE.

* * * * *